(12) United States Patent
Liu et al.

(10) Patent No.: US 12,368,142 B2
(45) Date of Patent: Jul. 22, 2025

(54) DOUBLE SIDE INTEGRATION SEMICONDUCTOR PACKAGE AND METHOD OF FORMING THE SAME

(71) Applicant: Taiwan Semiconductor Manufacturing Company Limited, Hsinchu (TW)

(72) Inventors: Monsen Liu, Hsinchu (TW); Shang-Lun Tsai, Hsinchu (TW); Shuo-Mao Chen, New Taipei (TW); Shin-Puu Jeng, Po-Shan Village (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 460 days.

(21) Appl. No.: 17/826,780

(22) Filed: May 27, 2022

(65) Prior Publication Data
US 2023/0402438 A1 Dec. 14, 2023

(51) Int. Cl.
*H01L 25/16* (2023.01)
*H01L 21/48* (2006.01)
(Continued)

(52) U.S. Cl.
CPC .......... *H01L 25/162* (2013.01); *H01L 23/481* (2013.01); *H01L 23/49816* (2013.01);
(Continued)

(58) Field of Classification Search
CPC ............ H01L 24/13; H01L 24/16; H01L 2224/16148; H01L 2224/16227;
(Continued)

(56) References Cited

U.S. PATENT DOCUMENTS

| | | | | |
|---|---|---|---|---|
| 2006/0092610 A1* | 5/2006 | Hegde | ............... | H01L 23/42 257/E23.087 |
| 2019/0148342 A1* | 5/2019 | Hu | ............... | H01L 25/105 257/659 |

(Continued)

FOREIGN PATENT DOCUMENTS

| TW | 201432871 A | 8/2014 |
|---|---|---|
| TW | 202002052 A | 1/2020 |

(Continued)

OTHER PUBLICATIONS

Taiwanese Patent and Trademark Office; TW application No. 112108494; Office Action mailed Feb. 29, 2024, 24 pages.

*Primary Examiner* — Moazzam Hossain
(74) *Attorney, Agent, or Firm* — The Marbury Law Group, PLLC

(57) ABSTRACT

An embodiment semiconductor device includes a first die package component, a second interposer electrically coupled to a first side of the first die package component, a third interposer having a voltage regulator circuit electrically coupled to a second side of the first die package component, and an optical component and a high-bandwidth-memory die, each electrically coupled to the second interposer. The first die package component may further include a double-sided semiconductor die, such that a first side of the double-sided semiconductor die is electrically coupled to the second interposer, and a second side of the double-sided semiconductor die is electrically coupled to the third interposer. The first die package component may further include a molding material and a through-molding-via formed in the molding material, such that the through-molding-via provides an electrical connection between the second interposer and the third interposer that bypasses the double-sided semiconductor die.

20 Claims, 16 Drawing Sheets

(51) Int. Cl.
   *H01L 23/00* (2006.01)
   *H01L 23/48* (2006.01)
   *H01L 23/498* (2006.01)

(52) U.S. Cl.
   CPC .. *H01L 23/49833* (2013.01); *H01L 23/49838* (2013.01); *H01L 24/16* (2013.01); *H01L 25/167* (2013.01); H01L 21/4853 (2013.01); H01L 25/165 (2013.01); H01L 2224/16148 (2013.01); H01L 2224/16227 (2013.01); H01L 2224/16238 (2013.01); H01L 2924/1427 (2013.01); H01L 2924/1434 (2013.01); H01L 2924/16152 (2013.01); H01L 2924/16251 (2013.01); H01L 2924/182 (2013.01); H01L 2924/183 (2013.01)

(58) Field of Classification Search
   CPC ..... H01L 2224/16238; H01L 2924/182; H01L 21/4853; H01L 24/97; H01L 2224/97; H01L 2023/4087; H01L 2225/1041; H01L 2225/107
   See application file for complete search history.

(56) References Cited

U.S. PATENT DOCUMENTS

| | | | |
|---|---|---|---|
| 2022/0013445 A1* | 1/2022 | Kim | H01L 21/4857 |
| 2023/0098957 A1* | 3/2023 | Eid | H01L 25/0652 257/691 |
| 2023/0109629 A1* | 4/2023 | Sato | H01L 25/0652 361/783 |
| 2023/0298964 A1* | 9/2023 | Salama | H01L 23/5384 |

FOREIGN PATENT DOCUMENTS

| | | |
|---|---|---|
| TW | 202114492 A | 4/2021 |
| TW | 202117945 A | 5/2021 |
| TW | 202134713 A | 9/2021 |
| TW | 202139373 A | 10/2021 |
| TW | 202147545 A | 12/2021 |
| TW | 202205560 A | 2/2022 |
| TW | 202220131 A | 5/2022 |

* cited by examiner

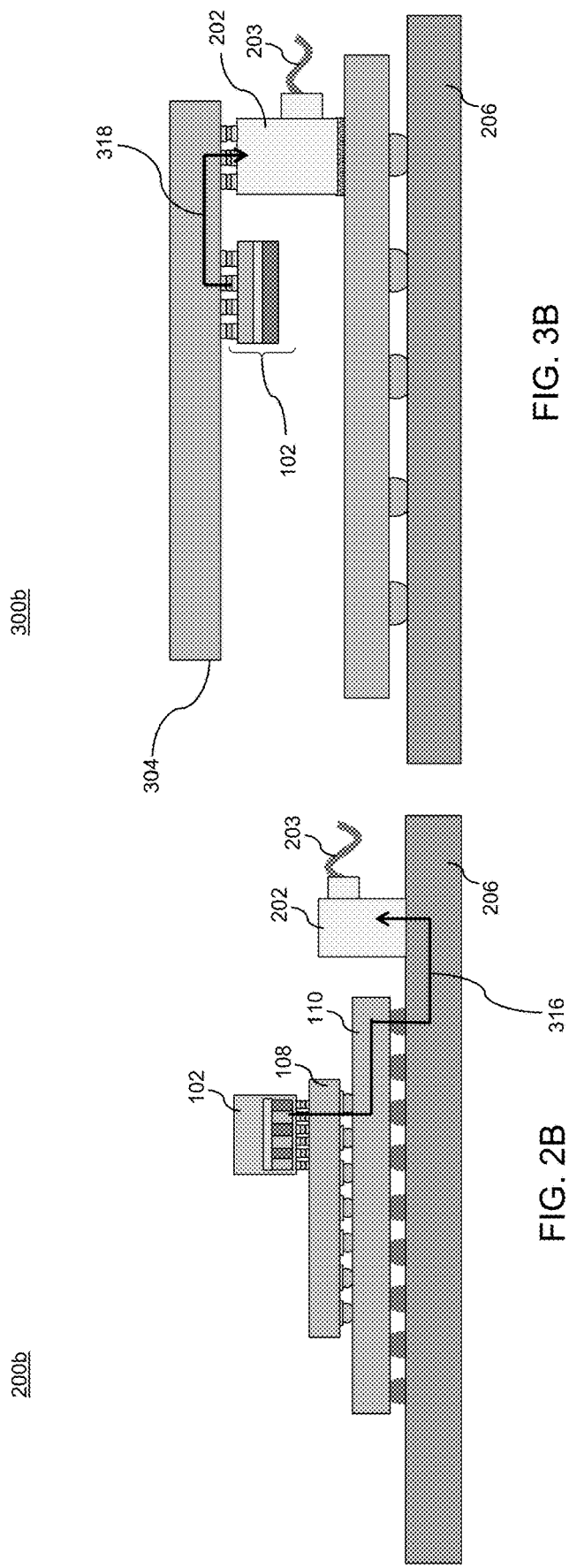

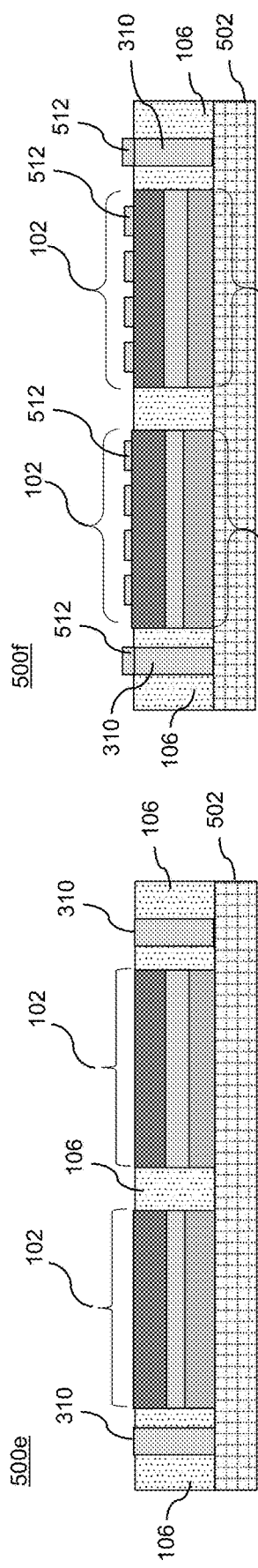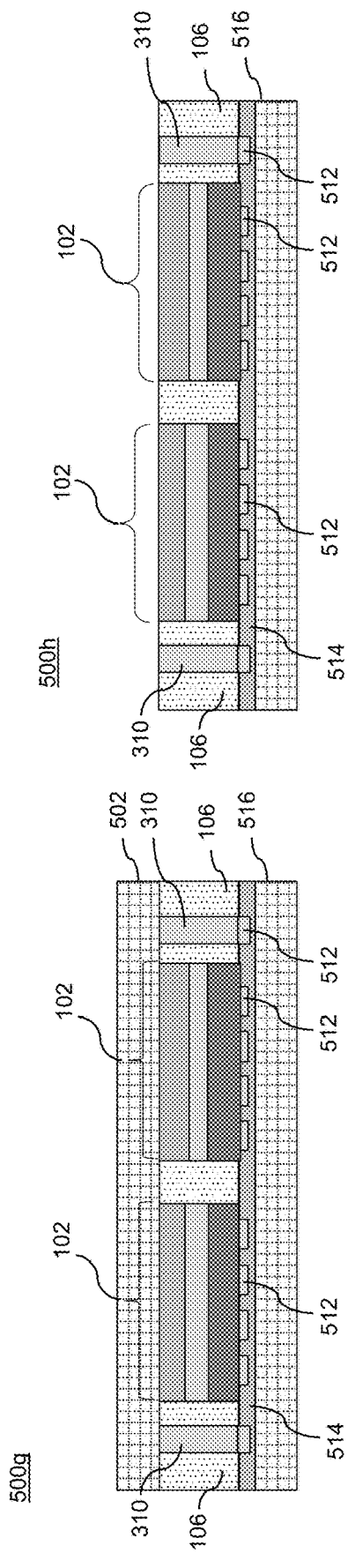

DOUBLE SIDE INTEGRATION SEMICONDUCTOR PACKAGE AND METHOD OF FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers over a semiconductor substrate, and patterning the various material layers using lithography and etching to form circuit components and elements thereon. Dozens or hundreds of integrated circuits are typically manufactured on a single semiconductor wafer, and individual dies on the wafer are singulated by sawing between the integrated circuits along scribe lines. The individual dies are typically packaged separately, in multi-chip modules, or in other types of packaging, for example.

As semiconductor packages have become more complex, package sizes have tended to become larger to accommodate greater numbers of integrated circuits and/or dies per package. These larger and more complex semiconductor packages have created challenges in making effective and reliable interconnections among various components of the semiconductor package. As such, there is an ongoing need for improvements to semiconductor package designs with an emphasis on reducing interconnect lengths to thereby reduce ohmic loss, heat generation, and signal delay.

BRIEF DESCRIPTION OF THE DRAWINGS

Aspects of this disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2B is a vertical cross-sectional view of a structure including a first sub-set of components of the semiconductor device of FIG. 2A.

FIG. 3B is a vertical cross-sectional view of a structure including a first sub-set of components of the semiconductor device of FIG. 3A, according to various embodiments.

FIG. 5E is a vertical cross-sectional view of a further intermediate structure that may be used in forming the first die package component, according to various embodiments.

FIG. 5F is a vertical cross-sectional view of a further intermediate structure that may be used in forming the first die package component, according to various embodiments.

FIG. 5G is a vertical cross-sectional view of a further intermediate structure that may be used in forming the first die package component, according to various embodiments.

FIG. 5H is a vertical cross-sectional view of a further intermediate structure that may be used in forming the first die package component, according to various embodiments.

DETAILED DESCRIPTION

Figure 1A:
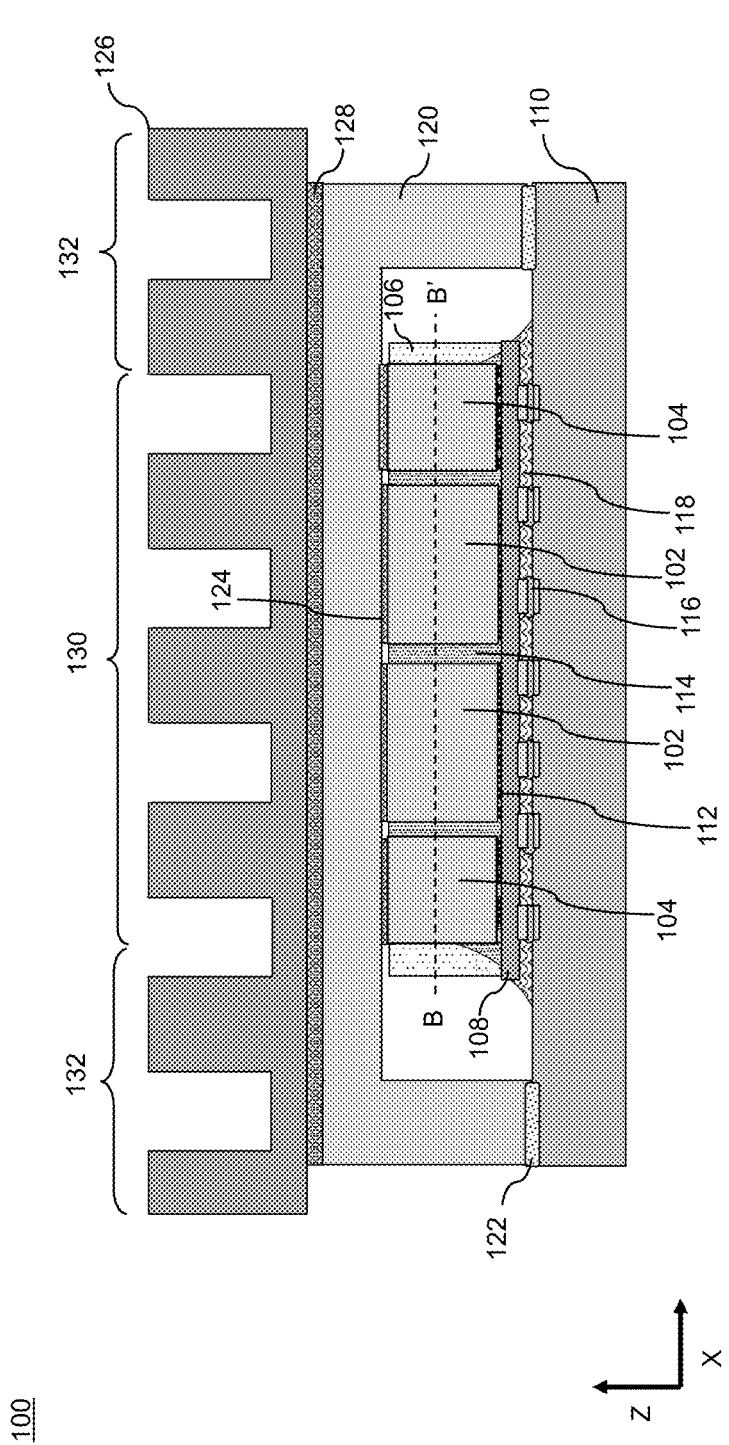
FIG. 1A is a vertical cross-sectional view of a semiconductor device along line AA' in FIG. 1B, according to various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Typically, in a semiconductor package, a number of semiconductor integrated circuit (IC) dies (i.e., "chips") may be mounted onto a common substrate. The semiconductor package typically includes a housing that encloses the IC dies to protect the IC dies from damage. The housing may also provide sufficient heat dissipation from the semiconductor package. In some cases, the semiconductor package may include a package lid that may include a thermally-conductive material (e.g., a metal or metal alloy, such as copper). The package lid may be located over the IC dies. Heat from the IC dies may be transferred from the upper surfaces of the IC dies into the package lid and may be ultimately dissipated to the environment. The heat may optionally be dissipated through a heat sink that may be attached to or may be integrally formed with the lid or through other components of the semiconductor package.

Increasing complexity of semiconductor package devices gives rise to challenges related to the need to reduce ohmic loss to thereby reduce heat generation and signal propagation delay. To mitigate such issues, new designs are needed to reduce interconnect lengths by increasing package integration. Various embodiments disclosed herein may provide advantages over existing semiconductor packages by using a multi-interposer stacked configuration that reduces interconnect lengths by placing components closer to one another. In this regard, various embodiment semiconductor device disclosed herein may integrate an optical system, a high-bandwidth memory die, voltage regulator circuits, and logic and control circuits on a single package substrate. The optical system and the high-bandwidth memory die may be configured to communicate with one another through a passive interposer. The passive interposer may be stacked with a first active interposer that includes control and logic circuitry, which in turn, communicates with a further stacked active interposer that includes the voltage regulator circuits. The stacked configuration of the three interposers may provide a semiconductor device with a high degree of integration and relatively short interconnect lengths.

An embodiment semiconductor device may include a first die package component (also referred to as a first interposer), a second interposer electrically coupled to a first side of the first die package component, a third interposer having a voltage regulator circuit electrically coupled to a second side of the first die package component, and an optical component electrically coupled to the second interposer. The first die package component may further include a double-sided semiconductor die, such that a first side of the double-sided semiconductor die is electrically coupled to the second interposer, and a second side of the double-sided semiconductor die is electrically coupled to the third interposer. The first die package component may further include a molding material and a through-molding-via formed in the molding material, such that the through-molding-via provides an electrical connection between the second interposer and the third interposer that bypasses the double-sided semiconductor die. The semiconductor device may further include a high-bandwidth-memory die electrically coupled to the second interposer.

In a further embodiment, a semiconductor device may include a first die package component that includes a double-sided semiconductor die, a molding material that supports the double-sided semiconductor die, and a through-molding-via formed in the molding material. The semiconductor device may further include a second interposer, a third interposer having a voltage regulator circuit, and an optical component. The first die package component and the optical component may be electrically coupled to, and disposed on a bottom surface of, the second interposer, and the third interposer may be electrically coupled to, and disposed on a bottom surface of, the first die package component. A first side of the double-sided semiconductor die may be electrically coupled to the second interposer, the second interposer may be electrically coupled to a high-bandwidth-memory die, a second side of the double-sided semiconductor die may be electrically coupled to the third interposer, and the through-molding-via may be configured to provide an electrical connection between the second interposer and the third interposer that bypasses the double-sided semiconductor die. The double-sided semiconductor die may further include an input/output circuit, configured to control the optical component to transmit and receive optical signals, and a power routing circuit configured to receive electrical power from the voltage regulator circuit of the third interposer.

In a further embodiment, a method of fabricating a semiconductor device may be provided. The method may include forming a first die package component as an active double-sided interposer; attaching a second interposer to a first side of the first die package component such that the second interposer is electrically coupled to the first die package component; attaching an optical component to the second interposer such the optical component is electrically coupled to the second interposer; forming a third interposer as an active interposer having a voltage regulator circuit; and attaching the third interposer to a second side of the first die package component such that the third interposer is electrically coupled to the first die package component. The operation of forming the first die package component may further include forming a double-sided semiconductor die having electrical connections on opposite sides of the double-sided semiconductor die; forming a molding material that supports the double-sided semiconductor die; and forming a through-molding-via in the molding material. The through-molding-via may be configured to provide an electrical connection between the second interposer and the third interposer that bypasses the double-sided semiconductor die.

The method may further include attaching a high-bandwidth-memory die to the first die package component such that the high-bandwidth-memory die is electrically coupled to the second interposer. The method may further include attaching a package substrate to the third interposer such that the third interposer is electrically coupled to the package substrate, and such that the third interposer is configured to receive electrical power from the package substrate. The method may further include attaching a package lid to the package substrate such that the package lid is covering a surface of the second interposer opposite to the first die package component.

Figure 1B:
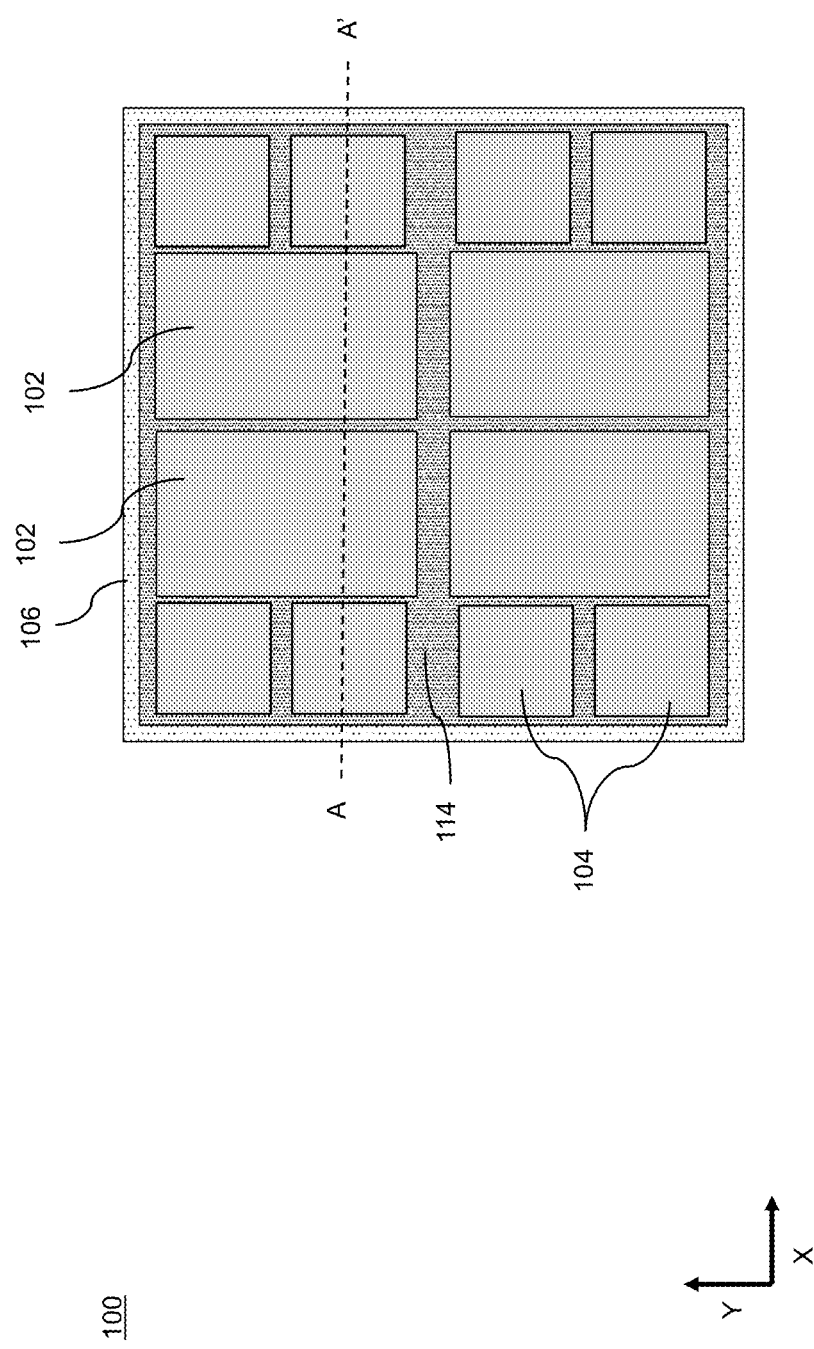
FIG. 1B is a horizontal cross-sectional view of the semiconductor device along line BB' in FIG. 1A, according to various embodiments.

FIG. 1A is a vertical cross-sectional view of a semiconductor device 100 according to various embodiments. FIG. 1B is a horizontal cross-sectional view of the semiconductor device 100 defined by a horizontal plane indicated by the line B-B' in FIG. 1A. The view of FIG. 1A is defined by a vertical plane indicated by the line A-A' in FIG. 1B. The semiconductor device 100 may include one or more integrated circuit (IC) semiconductor devices. For example, the semiconductor device 100 may include a plurality of first semiconductor dies 102 and a plurality of second semiconductor dies 104. In various embodiments, each first semiconductor die 102 may be configured as a three-dimensional device, such as a three-dimensional integrated circuit (3DIC), a system-on-chip (SoC) device, or a system-on-integrated-circuit (SoIC) device.

Each of the first semiconductor dies 102 may be formed by placing chips over chips on a semiconductor wafer level. These three-dimensional devices may provide improved integration density and other advantages, such as faster speeds and higher bandwidths, due to a decreased length of interconnects between the stacked chips. In some embodiments, one of the first semiconductor dies 102 may also be referred to as a "first die stack." In some embodiments, each of the first semiconductor dies 102 may be dies or chips, such as logic dies, power management dies, voltage regulator dies, etc.

In the semiconductor device 100 of FIGS. 1A and 1B, the plurality of first semiconductor dies 102 includes four first die stacks, each of which may be configured as a SoC device. In various embodiments, the first semiconductor dies 102 may be adjacent to one another and may be located in a central portion of the semiconductor device 100. The semiconductor device 100 may further include one or more second semiconductor dies 104. In some embodiments, the one or more second semiconductor dies 104 may be three-dimensional IC semiconductor devices, and may also be referred to as "second die stacks." In some embodiments, the second semiconductor dies 104 may each be a semiconductor memory device, such as a high bandwidth memory (HBM) device.

In the embodiment shown in FIGS. 1A and 1B, the plurality of second semiconductor dies 104 includes eight second die stacks, each of which may be an HBM device. The second semiconductor dies 104 may be located on a periphery around the first semiconductor dies 102, as shown in FIG. 1B. A molding material 106, which may include an epoxy-based material, may be located around the periphery of the first semiconductor dies 102 and the second semiconductor dies 104. Although the embodiment illustrated in FIGS. 1A and 1B includes four (4) first semiconductor dies 102 and eight (8) second semiconductor dies 104, greater or fewer die stacks may be included in the package.

Referring again to FIG. 1A, the first semiconductor dies 102 and the second semiconductor dies 104 may be mounted on an interposer 108. In some embodiments, the interposer 108 may be an organic interposer including a polymer dielectric material (e.g., a polyimide material) having a plurality of metal interconnect structures extending therethrough. In other embodiments, the interposer 108 may be a semiconductor interposer, such as a silicon interposer, having a plurality of interconnect structures (e.g., through-silicon vias) extending therethrough. Other suitable configurations for the interposer are contemplated within the scope of the disclosure. The interposer 108 may include a plurality of conductive bonding pads (not shown) on upper and lower surfaces of the interposer 108 and a plurality of conductive interconnects (not shown) extending through the interposer 108 between the upper and lower bonding pads of the interposer 108.

The conductive interconnects may distribute and route electrical signals between IC semiconductor devices (e.g., first semiconductor dies 102 and second semiconductor dies 104) and a package substrate 110. Thus, the interposer 108 may also be referred to as redistribution layers (RDLs). A plurality of first metal bumps 112, such as micro-bumps, may electrically connect conductive bonding pads on the bottom surfaces of the first semiconductor dies 102 and second semiconductor dies 104 to the conductive bonding pads on the upper surface of the interposer 108. In one non-limiting embodiment, first metal bumps 112 in the form of micro-bumps may include a plurality of first metal stacks, such as a plurality of Cu—Ni—Cu stacks, located on the bottom surfaces of the first semiconductor dies 102 and the second semiconductor dies 104. A corresponding plurality of second metal stacks (e.g., Cu—Ni—Cu stacks) may be located on the upper surface of the interposer 108. A solder material, such as tin (Sn), may be located between respective first and second metal stacks to electrically connect the first semiconductor dies 102 and the second semiconductor dies 104 to the interposer 108. Other suitable materials for the first metal bumps 112 are within the contemplated scope of this disclosure.

A first underfill material portion 114 may be provided in the spaces surrounding the first metal bumps 112 and between the bottom surfaces of the first semiconductor dies 102, the second semiconductor dies 104, and the upper surface of the interposer 108. The first underfill material portion 114 may also be provided in the spaces laterally separating adjacent die stacks (i.e., first semiconductor dies 102 and second semiconductor dies 104) of the semiconductor device 100. Thus, the first underfill material portion 114 may extend over side surfaces of the first semiconductor dies 102 and/or the second semiconductor dies 104, as shown in FIG. 1A. In various embodiments, the first underfill material portion 114 may include an epoxy-based material, which may include a composite of resin and filler materials. Other underfill materials are within the contemplated scope of this disclosure.

The interposer 108 may be located on a package substrate 110, which may provide mechanical support for the interposer 108 and the IC semiconductor devices (e.g., first semiconductor dies 102 and second semiconductor dies 104) that are mounted thereon. The package substrate 110 may include a suitable material, such as a semiconductor material (e.g., a semiconductor wafer, such as a silicon wafer), a ceramic material, an organic material (e.g., a polymer and/or thermoplastic material), a glass material, combinations thereof, etc. Other suitable substrate materials are within the contemplated scope of this disclosure. In various embodiments, the package substrate 110 may include a plurality of conductive bonding pads in an upper surface of the package substrate 110. A plurality of second metal bumps 116, such as C4 solder bumps, may electrically connect conductive bonding pads on the bottom surface of the interposer 108 to the conductive bonding pads on the upper surface of the package substrate 110. In various embodiments, the second metal bumps 116 may include a suitable solder material, such as tin (Sn).

A second underfill material portion 118 may be provided in the spaces surrounding the second metal bumps 116 and between the bottom surface of the interposer 108 and the upper surface of the package substrate 110. In various embodiments, the second underfill material portion 118 may include an epoxy-based material, which may include a composite of resin and filler materials. The second underfill material portion 118 may be the same material as the first underfill material portion 114 or may be a different material.

A package lid 120 may be disposed over the upper surfaces of the IC semiconductor devices (e.g., the first semiconductor dies 102 and the second semiconductor dies 104). The package lid 120 may also laterally surround the IC semiconductor devices (e.g., the first semiconductor dies 102 and the second semiconductor dies 104) such that the first semiconductor dies 102 and the second semiconductor dies 104 are fully-enclosed by the combination of the package substrate 110 and the package lid 120. In other embodiments, the package lid 120 may only partially enclose the first semiconductor dies 102 and the second semiconductor dies 104. For example, the package lid 120 may have one or more vent holes (not shown) to allow moisture and vapors to escape the package lid 120.

The package lid 120 may be attached to an upper surface of the package substrate 110 with an adhesive 122. In various embodiments, the adhesive 122 may be a thermally-conductive adhesive. Other suitable adhesive materials are within the contemplated scope of this disclosure. In some embodiments, the package lid 120 may be integrally formed or may include pieces. For example, the package lid 120 may include a ring portion (not shown) surrounding the first semiconductor dies 102 and the second semiconductor dies 104, a cover portion covering the ring portion, the first semiconductor dies 102, and the second semiconductor dies 104, and an adhesive (not shown) connecting the cover portion to the ring portion.

In some embodiments, a first thermal interface material 124 may be disposed between an upper surface of each of the IC semiconductor devices (e.g., the first semiconductor dies 102 and the second semiconductor dies 104) and an interior surface of the package lid 120. In various embodiments, the first thermal interface material 124 may include a gel-type thermal interface material having a relatively high thermal conductivity. Other suitable materials for the first thermal interface material 124 are within the contemplated scope of this disclosure. In some embodiments, the first thermal interface material 124 may include a single thermal interface material piece covering both the first semiconductor dies 102 and the second semiconductor dies 104, or two or more thermal interface material pieces corresponding to each of the first semiconductor dies 102 and the second semiconductor dies 104.

In some embodiments, a heat sink 126 may be provided on an upper surface of the package lid 120. The heat sink 126 may include fins or other features that may be configured to increase a surface area between the heat sink 126 and a cooling fluid, such as ambient air. In some embodiments, the heat sink 126 may be a separate component that may be attached to an upper surface of the package lid 120, as shown in FIG. 1A. Alternatively, the heat sink 126 may be integrally formed with the package lid 120. In embodiments in which the heat sink 126 is a separate component from the package lid 120, a second thermal interface material 128 may be located between the upper surface of the package lid 120 and a bottom surface of the heat sink 126. In various embodiments, the second thermal interface material 128 may include a gel-type thermal interface material having a relatively high thermal conductivity. Other suitable materials for the second thermal interface material 128 are within the contemplated scope of this disclosure. The heat sink 126 may include a suitable thermally-conductive material, such as a metal (e.g., copper) or metal alloy.

In various embodiments, a central region 130 of the semiconductor device 100 may be a region of the semiconductor device 100 that includes a relatively higher density of the one or more integrated circuit (IC) semiconductor devices, such as the first semiconductor dies 102 and the second semiconductor dies 104, as shown in FIGS. 1A and 1B. The semiconductor device 100 may include peripheral regions 132. Each of the peripheral regions 132 may be a region of the semiconductor device 100 that has a relatively lower density of integrated circuit (IC) semiconductor devices, including a region that does not include any IC semiconductor devices.

In the embodiment of FIGS. 1A and 1B, excessive heat accumulation in the semiconductor device 100 may be more likely to occur in the central region 130 of the semiconductor device 100 that includes the highest density of IC semiconductor devices (e.g., the first semiconductor dies 102 and the second semiconductor dies 104) than in the peripheral regions 132 of the semiconductor device 100. This may be because the majority of the heat in the semiconductor device 100 is generated by the IC semiconductor devices (e.g., the first semiconductor dies 102 and the second semiconductor dies 104) in the central region 130 of the semiconductor device 100. As such, heat transfer through the package lid 120 may occur primarily along the vertical direction (i.e., the direction of the z-axis in FIG. 1A) rather than spreading horizontally through the semiconductor device 100 (i.e., along the x-axis and y-axis directions in FIGS. 1A and 1B). Thus, the portion of the package lid 120 overlying the IC semiconductor devices (e.g., 102, 104) in the central region 130 of the semiconductor device 100 may be the hottest portion of the package lid 120 during operation of the semiconductor device.

The concentration of heat generating elements and the hottest portion of the package lid 120 being located in the central region may result in overheating and damage to the semiconductor device 100 if the rate of heat loss from the central region 130 of the semiconductor device 100 is not sufficiently high. In practice, this means that the package lid 120 may include a material having a very high thermal conductivity, such as copper, which has a thermal conductivity of about 398 W/m·K. However, such high-thermal conductivity materials are typically relatively expensive, which may increase the costs of the semiconductor device 100.

Figure 2A:
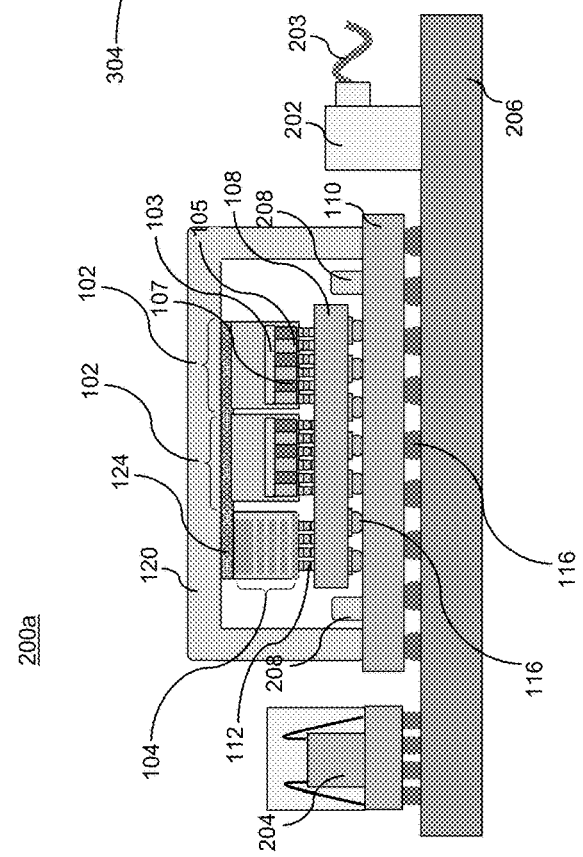
FIG. 2A is a vertical cross-sectional view of a semiconductor device including an optical component and a voltage regulator circuit.

FIG. 2A is a vertical cross-sectional view of a semiconductor device 200a including an optical component 202 and a voltage regulator circuit 204. The optical component 202 may be a laser, a photo-detector, a combined laser/detector system. The optical component 202 may be configured to transmit and receive data using optical channels. For example, the optical component may be coupled to an optical fiber 203 that may be configured to transmit and receive optical signals to and from other system components. In other embodiments, the optical fiber 203 may be omitted in embodiments configured to transmit and receive signals using a free-space optical communication system. In other embodiments, the optical component 202 may be configured to send and receive optical signals to and from optical photonic circuits (e.g., photonic circuits formed in a semiconductor substrate).

The semiconductor device 200a may be configured as a semiconductor package structure, as described above with reference to FIGS. 1A and 1B. In this regard, the semiconductor device 200a may include one or more first semiconductor dies 102 and one or more second semiconductor dies 104 attached to an interposer 108. The one or more first semiconductor dies 102 may include one or more transistor layers 103 coupled to signal routing layers 105, and to power routing layers 107. The interposer 108 may be attached to a package substrate 110, which may further be attached to a printed circuit board (PCB) 206. The PCB 206 may be configured to provide electrical pathways coupling the voltage regulator circuit 204 to the one or more first semiconductor dies 102, and coupling the optical component 202 to the one or more first semiconductor dies 102, as described in greater detail with reference to FIGS. 2B and 2C, below.

The first semiconductor dies 102 may include communication circuitry configured to control the optical component 202. For example, the first semiconductor dies 102 may be configured to generate electrical signals that may be provided to the optical component 202. The optical component 202 may then generate and transmit optical signals based on the electrical signals received from the first semiconductor dies 102. Similarly, the optical component 202 may receive optical signals (e.g., using a photo-detector) and may convert the optical signals to electrical signals that may then be received by the first semiconductor dies 102. In an example embodiment, the one or more second semiconductor dies 104 may be an HBM device that may be configured to store data provided by the one or more first semiconductor dies 102. In this way, the semiconductor device 200a may be configured as a computing device including logic circuits, implemented in the one or more first semiconductor dies 102, one or more memory devices (e.g., a second semiconductor die 104 implemented as an HBM), and an optical input/output (IO) device (e.g., implemented by the optical component 202). In other embodiments, the optical component 202 may be replaced by an electrical IO device.

The voltage regulator circuit 204 may be configured to receive electrical power through the PCB 206 and to provide electrical power to the various components of the semiconductor device 200a. For example, it may be advantageous to regulate a voltage provided to the one or more first semiconductor dies 102, the one or more second semiconductor dies 104, and the optical component 202. As such, the voltage regulator circuit 204 may include separate circuits that may be configured to regulate voltages for the separate respective components of the semiconductor device 200a.

The semiconductor device 200a may further include one or more substrate mounted devices 208, which may be mounted to, and electrically coupled to, the package substrate 110. The one or more substrate mounted devices 208 may include one or more passive electrical components such as capacitors, inductors, resistors, diodes, etc. The package substrate 110 and the interposer 108 may provide electrical pathways that electrically couple the one or more substrate mounted devices 208 to the one or more first semiconductor dies 102.

As described with reference to FIGS. 1A and 1B, above, the semiconductor device 200a may further include a package lid 120 that may be attached to the package substrate 110. As shown, the package lid 120 may cover components of the semiconductor device 200a including the one or more first semiconductor dies 102, the one or more second semiconductor dies 104, the interposer 108, the one or more substrate mounted devices 208, and a portion of the package substrate 110. The package lid 120 may completely enclose the various components of the semiconductor device 200a or the package lid 120 may only partially enclose the components of the semiconductor device 200a. For example, the package lid 120 may include one or more vent holes (not shown) that may allow moisture and vapors to escape the semiconductor device 200a.

The semiconductor device 200a may further include a first thermal interface material 124 that may be disposed between an upper surface of each of the IC semiconductor devices (e.g., the one or more first semiconductor dies 102 and the one or more second semiconductor dies 104) and an interior surface of the package lid 120. As described above, the first thermal interface material 124 may be configured to conduct heat generated by the IC semiconductor devices and to transmit such heat to the package lid 120. In turn, the package lid 120 may act as a heat sink to remove the generated heat from the semiconductor device 200a. Alternatively, the semiconductor device 200a may further include an external heat sink (not shown) as described above with reference to FIG. 1A (e.g., see heat sink 126 in FIG. 1A).

The semiconductor device 200a may further include a plurality of first metal bumps 112, such as micro-bumps, which may electrically connect conductive bonding pads on a bottom surface of the one or more first semiconductor dies 102, and the one or more second semiconductor dies 104, to conductive bonding pads on an upper surface of the interposer 108. The semiconductor device 200a may further include a plurality of second metal bumps 116, such as C4 solder bumps, which may electrically connect conductive bonding pads on the bottom surface of the interposer 108 to conductive bonding pads (not shown) on the upper surface of the package substrate 110. In various embodiments, the second metal bumps 116 may include a suitable solder material, such as tin (Sn). Similarly, a further a plurality of second metal bumps 116 may electrically connect conductive bonding pads (not shown) on a bottom surface of the package substrate 110 to conductive bonding pads (not shown) on an upper surface of the PCB 206.

Although not shown in FIG. 2A, in other embodiments, the semiconductor device 200a may further include a first underfill material portion 114 (e.g., see FIG. 1A) that may be provided in the spaces surrounding the first metal bumps 112 and between a bottom surface of the IC semiconductor devices (e.g., the one or more first semiconductor dies 102 and the one or more second semiconductor dies 104) and a top surface of the interposer 108. Similarly, in other embodiments, the semiconductor device 200a may include a second underfill material portion 118 (e.g., see FIG. 1A) that may be provided in the spaces surrounding the second metal bumps 116 and between a bottom surface of the interposer 108 and a top surface of the package substrate 110.

Figure 3A:
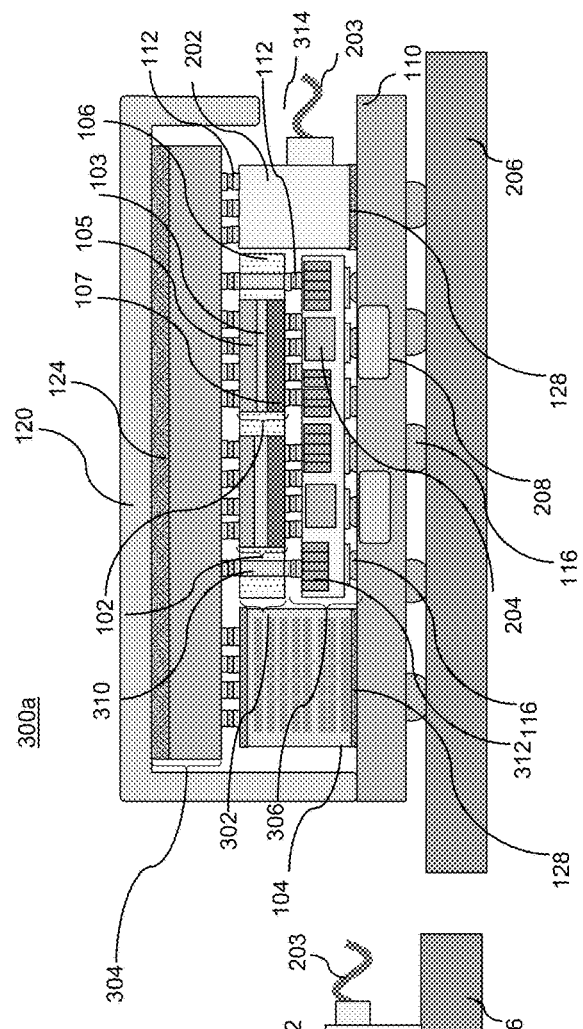
FIG. 3A is a vertical cross-sectional view of a further semiconductor device including an optical component and a voltage regulator circuit, according to various embodiments.

FIG. 3A is a vertical cross-sectional view of a further semiconductor device 300a including an optical component 202 and a voltage regulator circuit 204, according to various embodiments. As shown, the voltage regulator circuit 204 may be directly connected to the first die package component 302 by metal bumps 112, and the optical component 202 may be connected to the second interposer 304 by similar metal bumps 112. The semiconductor device 300a may provide similar functionality to the semiconductor device 200a of FIG. 2A. The semiconductor device 300a of FIG. 3A, however, may provide advantages over the semiconductor device 200a in that electrical pathways may be more densely integrated so that ohmic loss and signal delays may be reduced. In this regard, the semiconductor device 300a may have a configuration in which an electrical pathway between the optical component 202 and the one or more first semiconductor dies 102 is shorter in the configuration of the semiconductor device 300a (e.g., see FIG. 3B and related description, below) than a corresponding electrical pathway in the configuration of the semiconductor device 200a (e.g., see FIG. 2B and related description, below). Similarly, the semiconductor device 300a may have a configuration in which an electrical pathway between the voltage regulator circuit 204 and the one or more first semiconductor dies 102 is shorter in the configuration of semiconductor device 300a (e.g., see FIG. 3C and related description, below) than a corresponding electrical pathway in the configuration of the semiconductor device 200a (e.g., see FIG. 2C and related description, below).

The increased electrical integration of the semiconductor device 300a of FIG. 3A may be achieved using a configuration that includes a stacked, multi-interposer, structure. In this regard, the semiconductor device 300a may include a first die package component 302, a second interposer 304, and a third interposer 306 that are in a stacked configuration. The first die package component 302 is described in greater detail with reference to FIGS. 4A to 5I, below. The second interposer 304 may be electrically coupled to a first side (e.g., an upper side) of the first die package component 302, and the third interposer 306 may be electrically coupled to a second side (e.g., a lower side) of the first die package component 302. As shown, the optical component 202 may be electrically coupled to the second interposer 304 between a first side of the second interposer 304 (e.g., a lower side) and a first side of the optical component 202 (e.g., an upper side). A second side of the optical component 202 (e.g., a lower side) may be located adjacent to the package substrate 110, as shown in FIG. 3A.

The first die package component 302 may include one or more first semiconductor dies 102 that may be configured as double-sided semiconductor dies. In this regard, each of the one or more first semiconductor dies 102 may include first electrical connections on a first side (e.g., on an upper side) and second electrical connections on a second side (e.g., on a lower side) of the one or more first semiconductor dies 102. The first electrical connections may include signal routing layers 105 coupled to transistor layers 103, and the second electrical connections may include power routing layers 107 also connected to the transistor layers 103. As shown, the first electrical connections of the first die package component 302 may be electrically connected to the second interposer 304. As such, electrical pathways between the one or more first semiconductor dies 102 and the optical component 202 may be formed through electrical interconnect structures (not shown) within the second interposer 304 (e.g., see FIG. 3B and related description, below). Also as shown, the second electrical connections of the first die package component 302 may be electrically connected to the third interposer 306. As described in greater detail, below, the third interposer 306 may have one or more voltage regulator circuits 204 formed therein. Thus, the electrical pathways between the one or more first semiconductor dies 102 and the one or more voltage regulator circuits 204 may be formed through electrical interconnect structures (not shown) within the third interposer 306 (e.g., see FIG. 3C and related description, below).

The semiconductor device 300a may further include one or more second semiconductor dies 104. As described above, the one or more second semiconductor dies 104 may be configured as an HBM. The second semiconductor die 104 may be electrically connected to the second interposer 304. In this way, the semiconductor device 300a may be configured as a computing device including logic circuits, implemented in the one or more first semiconductor dies 102, one or more memory devices (e.g., a second semiconductor die 104 implemented as an HBM), and an optical input/output (IO) device (e.g., implemented by the optical component 202). In other embodiments, the optical component 202 may be replaced by an electrical input output (I/O) device.

In the semiconductor device 300a, the first die package component 302 may be configured as an active interposer (e.g., including the one or more first semiconductor dies 102 having transistor layers 103) that may be configured to control one or both of the optical component 202 and the second semiconductor die 104 (e.g., configured as an HBM). The second interposer 304 may be configured as a passive interposer (e.g., including electrical interconnects but no active circuit components), and the third interposer 306 may be configured as an active interposer including transistors, inductors, capacitors, resistors, diodes, etc., which form the one or more voltage regulator circuits 204. Further, the third interposer 306 may include two or more separate voltage regulator circuits 204 that may be configured to control electrical power provided to two or more respective components of the semiconductor device.

As mentioned above, and described in greater detail below (e.g., see FIGS. 2B to 3C), the electrical pathways within the semiconductor device 300a may be shorter and more highly integrated, thereby reducing ohmic loss, heat generation, signal delay, etc. In this regard, for example, the physical distance separating the one or more first semiconductor dies 102 from the optical component 202 and the one or more voltage regulator circuits 204 may be shorter than corresponding distances in the semiconductor device 200a. Further, the first die package component 302 may include additional conducting pathways between the second interposer 304 and the third interposer 306, as follows.

The first die package component 302 may include a molding material 106 that may be configured to physically support the one or more first semiconductor dies 102. The molding material 106 may further include one or more through-molding-vias 310 formed in the molding material 106. The one or more through-molding-vias 310 may provide a direct electrical connection between the second interposer 304 and the third interposer 306 that bypasses the one or more first semiconductor dies 102. In this way, the one or more voltage regulator circuits 204 in the third interposer 306 may provide power directly to the optical component 202 and the second semiconductor die 104 through connections within the second interposer 304. Such connections may have lower resistance and may thereby suffer lower ohmic loss than corresponding indirect connections in the semiconductor device 200*a* of FIG. 2A.

As with the semiconductor device 200*a*, the semiconductor device 300*a* may further include various additional components, such as one or more substrate mounted devices 208, which may include one or more passive electrical components such as capacitors, inductors, resistors, diodes, etc. As shown in FIG. 3A, for example, the one or more substrate mounted devices 208 may be formed within the package substrate 110 (i.e., embedded within package substrate 110) and may be located close to electrical connections between the package substrate 110 and the third interposer 306. In this way, the substrate mounted devices 208 of the semiconductor device 300*a* may be connected to other components of the semiconductor device 300*a* with shorter electrical pathways than corresponding connections in the semiconductor device 200*a*, in which the substrate mounted devices 208 are mounted on a surface of the package substrate 110 (e.g., see FIG. 2A). The semiconductor device 300*a* may include further passive components. For example, the third interposer 306 may include one or more capacitors, inductors, resistors, diodes, etc., formed within the third interposer 306 (i.e., embedded within the third interposer 306). As shown, the third interposer 306 may further include one or more deep trench capacitors 312.

As described with reference to FIGS. 1A, 1B, 2A and 3A, above, the semiconductor device 300*a* may further include a package lid 120 that may be attached to the package substrate 110. As shown, the package lid 120 may cover components of the semiconductor device 300*a* including a second side (e.g., an upper side) of the second interposer 304. The package lid 120 may completely enclose the various components of the semiconductor device 300*a* or the package lid 120 may only partially enclose the components of the semiconductor device 300*a*. For example, the package lid 120 may include one or more vent holes 314 that may allow moisture and vapors to escape the semiconductor device 300*a*. As shown in FIG. 3A, for example, the one or more vent holes 314 may further provide a space for the optical component 202 to communicate with other system components. For example, the optical component 202 may include an optical fiber 203 that may extend through an opening (e.g., a vent hole 314) in the package lid 120.

The semiconductor device 300*a* may further include a first thermal interface material 124 that may be disposed between the second surface of the second interposer 304 and an interior surface of the package lid 120. As described above, the first thermal interface material 124 may be configured to conduct heat generated by the IC semiconductor devices and to transmit such heat to the package lid 120. In turn, the package lid 120 may act as a heat sink to remove the generated heat from the semiconductor device 300*a*. Alternatively, the semiconductor device 300*a* may further include an external heat sink (not shown) as described above with reference to FIGS. 1A and 2A (e.g., see heat sink 126 in FIG. 1A).

The semiconductor device 300*a* may further include a second thermal interface material 128 formed between an upper surface of the package substrate 110 and one or both of the optical component 202 and the one or more second semiconductor dies 104. In this way, heat conduction between the package substrate 110 and the optical component 202 and/or the one or more second semiconductor dies 104 may be improved. As such, heat generated by the optical component 202 and/or the one or more second semiconductor dies 104 may be dissipated through the package substrate 110 by way of the second thermal interface material 128. Heat generated by the optical component 202 and/or the one or more second semiconductor dies 104 may further be indirectly dissipated through the second interposer 304, through the first thermal interface material 124, and out through the package lid 120.

The semiconductor device 300*a* may further include a plurality of first metal bumps 112, such as micro-bumps, which may electrically connect conductive bonding pads on one or more first semiconductor dies 102, the one or more second semiconductor dies 104, and the optical component to corresponding bonding pads on the second interposer 304. As shown, similar first metal bumps 112 may connect the one or more first semiconductor dies 102 to the third interposer 306. Also, as shown in FIG. 3A, first metal bumps 112 may further connect the through-molding-vias 310 to the second interposer 304 and the third interposer 306.

The semiconductor device 300*a* may further include a plurality of second metal bumps 116, such as C4 solder bumps, which may electrically connect conductive bonding pads on the lower surface of the third interposer 306 to the conductive bonding pads (not shown) on an upper surface of the package substrate 110. In various embodiments, the second metal bumps 116 may include a suitable solder material, such as tin (Sn). Similarly, a further a plurality of second metal bumps 116 may electrically connect conductive bonding pads (not shown) on a bottom surface of the package substrate 110 to conductive bonding pads (not shown) on an upper surface of a PCB 206. In this way, the third interposer 306 may be configured to receive electrical power from the package substrate 110 and to provide the electrical power to the first die package component 302 and to the second interposer 304. The electrical power received from the package substrate 110 may further be received by the package substrate 110 from the PCB 206.

FIG. 2B is a vertical cross-sectional view of a structure 200*b* including a first sub-set of components of the semiconductor device 200*a* of FIG. 2A. The structure 200*b* of FIG. 2B includes a first semiconductor die 102 electrically connected to the interposer 108, which in turn, is electrically connected to the package substrate 110. The package substrate 110 is further electrically connected to the PCB 206, which is further electrically connected to the optical component 202. As such, a first electrical pathway 316 is formed between the first semiconductor die 102 and the optical component 202. As shown, the first electrical pathway 316 includes portions of electrical connections in each of the interposer 108, the package substrate 110, and the PCB 206.

FIG. 3B is a vertical cross-sectional view of a structure 300*b* including a first sub-set of components of the semiconductor device 300*a* of FIG. 3A, according to various embodiments. The structure 300*b* of FIG. 3B includes a first semiconductor die 102 electrically connected to the second interposer 304, which in turn, is electrically connected to the optical component 202. As such, a second electrical pathway 318 may be formed between the first semiconductor die 102 and the optical component 202. As shown, the second electrical pathway 318 includes electrical connections formed in the second interposer 304 that connect the first semiconductor die 102 to the optical component 202. As such, the second electrical pathway 318 of the structure 300b is shorter than the first electrical pathway 316 of the structure 200b. Thus, the electrical pathways through the package substrate 110 and the PCB 206, of the structure 200b of FIG. 2B, are avoided in the structure 300b of FIG. 3B.

Figure 2C:
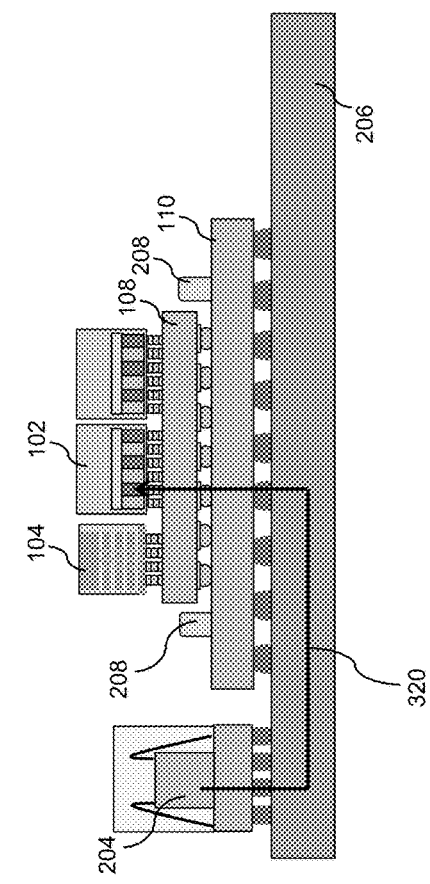
FIG. 2C is a vertical cross-sectional view of a further structure including a second sub-set of components of the semiconductor device of FIG. 2A.

FIG. 2C is a vertical cross-sectional view of a structure 200c including a second sub-set of components of the semiconductor device 200a of FIG. 2A. The structure 200c of FIG. 2C includes a first semiconductor die 102 electrically connected to the interposer 108, which in turn, is electrically connected to the package substrate 110. The package substrate 110 may be further electrically connected to the PCB 206, which is further electrically connected to the voltage regulator circuit 204. As such, a third electrical pathway 320 is formed between the first semiconductor die 102 and the voltage regulator circuit 204. As shown, the third electrical pathway 320 includes portions of electrical connections in each of the interposer 108, the package substrate 110, and the PCB 206.

Figure 3C:
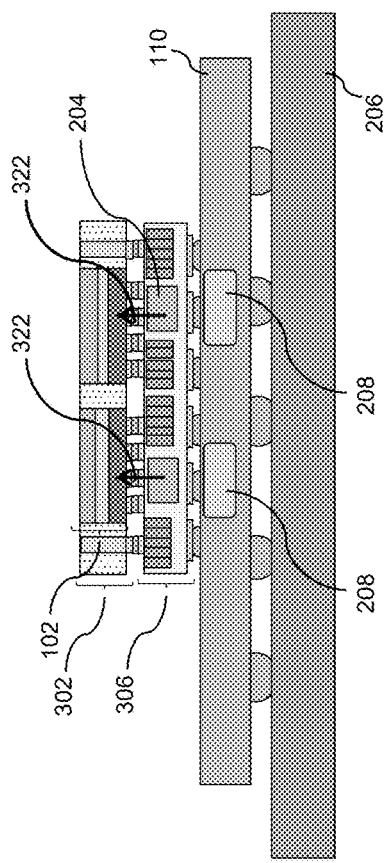
FIG. 3C is a vertical cross-sectional view of a further structure including a second sub-set of components of the semiconductor device of FIG. 3A, according to various embodiments.

FIG. 3C is a vertical cross-sectional view of a structure 300c including a second sub-set of components of the semiconductor device 300a of FIG. 3A, according to various embodiments. The structure 300c of FIG. 3C includes one or more first semiconductor dies 102 (formed as part of the first die package component 302) that are electrically connected to the third interposer 306, which in turn, is electrically connected to the one or more voltage regulator circuits 204. As such, a fourth electrical pathway 322 may be formed between the one or more first semiconductor dies 102 and the one or more voltage regulator circuits 204. As shown, the fourth electrical pathway 322 includes electrical connections formed between the third interposer 306 and the first die package component 302 that connect the first semiconductor die 102 to one or more voltage regulator circuits 204. As such, the fourth electrical pathway 322 of the structure 300c is shorter than the third electrical pathway 320 of the structure 200c. Thus, the electrical pathways through the package substrate 110 and the PCB 206, of the structure 200c of FIG. 2C, are avoided in the structure 300c of FIG. 3C.

Figure 4A:
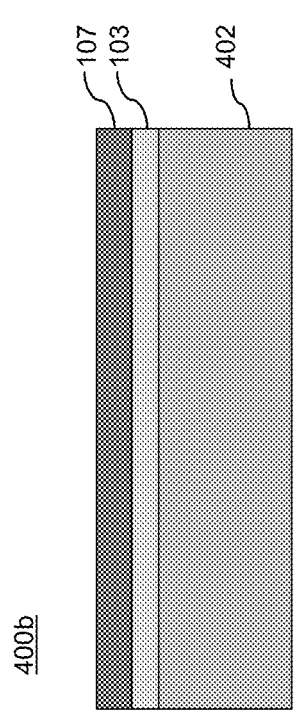
FIG. 4A is a vertical cross-sectional view of an intermediate structure that may be used in the formation of one or more double-sided semiconductor dies, according to various embodiments.
Figure 4B:
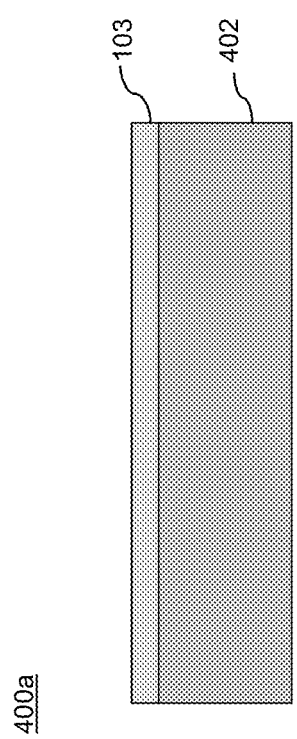
FIG. 4B is a vertical cross-sectional view of a further intermediate structure that may be used in the formation of one or more double-sided semiconductor dies, according to various embodiments.
Figure 4C:
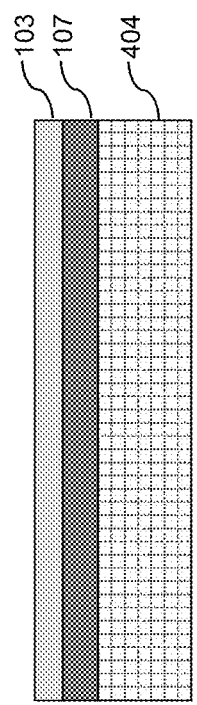
FIG. 4C is a vertical cross-sectional view of a further intermediate structure that may be used in the formation of one or more double-sided semiconductor dies, according to various embodiments.
Figure 4D:
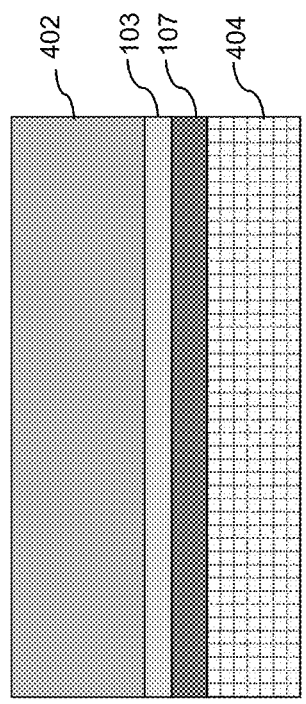
FIG. 4D is a vertical cross-sectional view of a further intermediate structure that may be used in the formation of one or more double-sided semiconductor dies, according to various embodiments.
Figure 4E:
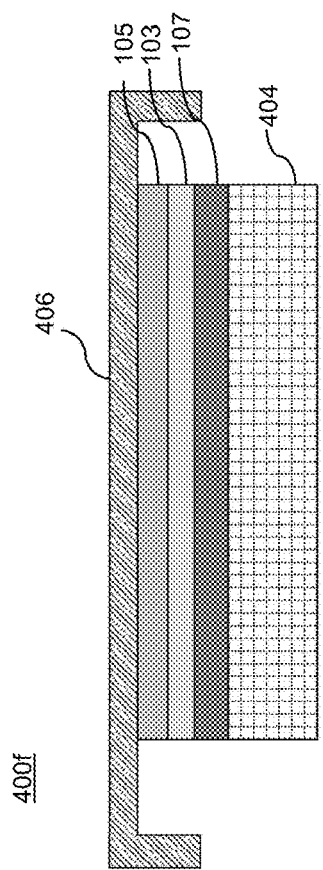
FIG. 4E is a vertical cross-sectional view of a further intermediate structure that may be used in the formation of one or more double-sided semiconductor dies, according to various embodiments.
Figure 4F:
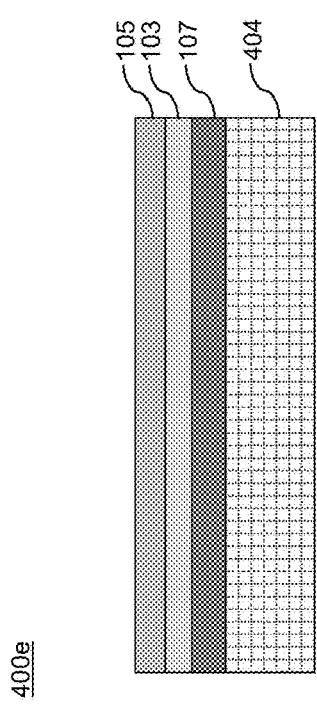
FIG. 4F is a vertical cross-sectional view of a further intermediate structure that may be used in the formation of one or more double-sided semiconductor dies, according to various embodiments.
Figure 4G:
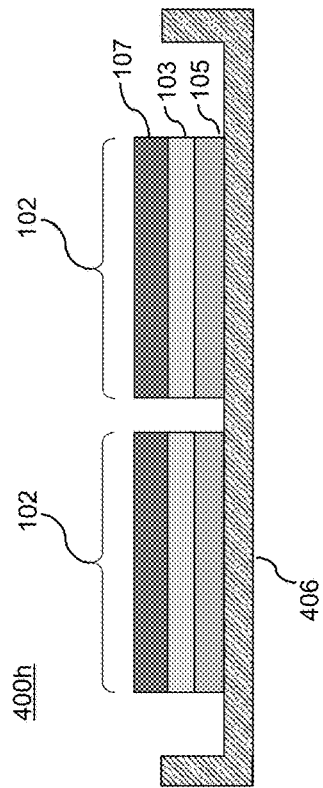
FIG. 4G is a vertical cross-sectional view of a further intermediate structure that may be used in the formation of one or more double-sided semiconductor dies, according to various embodiments.
Figure 4H:
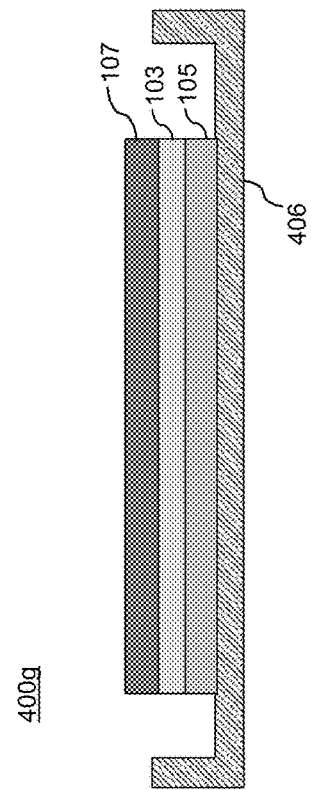
FIG. 4H is a vertical cross-sectional view of a structure including two double-sided semiconductor dies supported on a dicing frame, according to various embodiments.

FIGS. 4A to 4G are vertical cross-sectional views of respective intermediate structures 400a to 400g that may be used in the formation of one or more double-sided semiconductor dies (e.g., first semiconductor dies 102), and FIG. 4H is a vertical cross-sectional view of a structure including two double-sided semiconductor dies (e.g., first semiconductor dies 102) supported on a dicing frame 406, according to various embodiments. The intermediate structure 400a of FIG. 4A may include a semiconductor substrate 402 having a transistor layer 103 formed thereon. The semiconductor substrate 402 may include a bulk semiconductor substrate such as a silicon substrate in which the semiconductor material layer continuously extends from a top surface of the semiconductor substrate 402 to a bottom surface of the semiconductor substrate 402, or a semiconductor-on-insulator layer including a semiconductor material layer as a top semiconductor layer overlying a buried insulator layer (such as a silicon oxide layer). The transistor layer 103 may include various semiconductor devices such as field effect transistors (FETs) that may be formed on, and/or in, the semiconductor substrate 402 during a front-end-of-line (FEOL) operation.

FIG. 4B is a vertical cross-sectional view of a further intermediate structure 400b that may be used in the formation of one or more double-sided semiconductor dies (e.g., first semiconductor dies 102), according to various embodiments. The intermediate structure 400b may be formed from the intermediate structure 400a of FIG. 4A by forming power routing layers 107 over, and electrically connected to, the transistor layers 103. The power routing layers 107 may be formed to include one or more layers of interconnect structures. The interconnect structures may be formed in an interlayer dielectric layer (not shown) and may include a metallic liner (such as a layer of TiN, TaN, or WN having a thickness in a range from 2 nanometers (nm) to 20 nm) and a respective metallic fill material (such as W, Cu, Co, Mo, Ru, other elemental metals, or an alloy or a combination thereof). Other suitable materials for use as a metallic liner and metallic fill material are within the contemplated scope of disclosure.

FIG. 4C is a vertical cross-sectional view of a further intermediate structure 400c that may be used in the formation of one or more double-sided semiconductor dies (e.g., first semiconductor dies 102), according to various embodiments. The intermediate structure 400c, may be formed from the intermediate structure 400b of FIG. 4B by attaching a first carrier substrate 404 to the power routing layers 107 of the intermediate structure 400b of FIG. 4B. The first carrier substrate 404 may include an optically transparent substrate such as a glass substrate or a sapphire substrate. A thickness of the first carrier substrate 404 may be in a range from 500 microns to 2,000 microns, although lesser and greater thicknesses may also be used. An adhesive layer (not shown) may be applied to a surface of the first carrier substrate 404, and the adhesion layer may make contact with the power routing layers 107 to thereby attach the first carrier substrate 404 to the power routing layers 107. In one embodiment, the adhesive layer may be a light-to-heat conversion (LTHC) layer. The LTHC layer may be a solvent-based coating applied using a spin coating method. The LTHC layer may convert ultraviolet light to heat, which may cause the material of the LTHC layer to lose adhesion. Alternatively, the adhesive layer may include a thermally decomposing adhesive material. For example, the adhesive layer may include an acrylic pressure-sensitive adhesive that decomposes at an elevated temperature. The debonding temperature of the thermally decomposing adhesive material may be in a range from 150 degrees to 200 degrees Celsius.

FIGS. 4D and 4E are vertical cross-sectional views of respective intermediate structures 400d and 400e that may be used in the formation of one or more double-sided semiconductor dies, according to various embodiments. The intermediate structure 400d may be formed from the intermediate structure 400c of FIG. 4C by removing the semiconductor substrate 402. The semiconductor substrate 402 may be removed, for example, by etching and/or by mechanically removal such as by grinding. The intermediate structure 400e may be formed from the intermediate structure 400d by forming signal routing layers 105 over the transistor layers 103. In this regard, the signal routing layers 105 may be formed as one or more redistribution structures. The redistribution structures may include redistribution dielectric layers and redistribution wiring interconnects (not shown). The redistribution dielectric layers may include a respective dielectric polymer material such as polyimide (PI), benzocyclobutene (BCB), or polybenzobisoxazole (PBO). Other suitable materials may be within the contemplated scope of disclosure. Each redistribution dielectric layer may be formed by spin coating and drying of the respective dielectric polymer material. The thickness of each redistribution dielectric layer may be in a range from 2 microns to 40 microns, such as from 4 microns to 20 microns. Each redistribution dielectric layer may be patterned, for example, by applying and patterning a respective photoresist layer thereabove, and by transferring the pattern in the photoresist layer into the redistribution dielectric layer using an etch process such as an anisotropic etch process. The photoresist layer may be subsequently removed, for example, by ashing or by dissolution with a solvent.

Each of the redistribution wiring interconnects may be formed by depositing a metallic seed layer by sputtering, by applying and patterning a photoresist layer over the metallic seed layer to form a pattern of openings through the photoresist layer, by electroplating a metallic fill material (such as copper, nickel, or a stack of copper and nickel), by removing the photoresist layer (for example, by ashing), and by etching portions of the metallic seed layer located between the electroplated metallic fill material portions. The metallic seed layer may include, for example, a stack of a titanium barrier layer and a copper seed layer. The titanium barrier layer may have thickness in a range from 50 nm to 400 nm, and the copper seed layer may have a thickness in a range from 100 nm to 500 nm. The metallic fill material for the redistribution wiring interconnects may include copper, nickel, or copper and nickel. Other suitable metallic fill materials are within the contemplated scope of disclosure. The thickness of the metallic fill material that is deposited for each redistribution wiring interconnect (e.g., within interposer 108) may be in a range from 2 microns to 40 microns, such as from 4 microns to 10 microns, although lesser or greater thicknesses may also be used. The total number of levels of wiring in the signal routing layers 105 (i.e., the levels of the redistribution wiring interconnects) may be in a range from 1 to 10.

FIGS. 4F, 4G, and 4H are vertical cross-sectional views of respective intermediate structures 400f, 400g, and 400h that may be used in the formation of one or more double-sided semiconductor dies (e.g., first semiconductor dies 102), according to various embodiments. The intermediate structure 400f may be formed from the intermediate structure 400e by mounting a dicing frame 406 to the intermediate structure 400e of FIG. 4E. In this regard, the dicing frame 406 may be mounted to a surface of the signal routing layers 105. The dicing frame 406 may be mounted to the intermediate structure 400e using an adhesive layer (not shown). For example, a first side of a double-sided adhesive tape or film may be applied to the signal routing layers 105 to thereby attach the intermediate structure 400e to the first side of the adhesive tape or film. A second side of the adhesive tape or film may then be applied to a surface of the dicing frame 406 to thereby attach the signal routing layers 105 to the dicing frame 406.

The intermediate structure 400g of FIG. 4G may be formed from the intermediate structure 400f by removing the first carrier substrate 404. The adhesive layer (formed between the first carrier substrate 404 and the power routing layers 107) may be decomposed by ultraviolet radiation or by a thermal anneal at a debonding temperature. In embodiments in which the first carrier substrate 404 includes an optically transparent material and the adhesive layer includes an LTHC layer, the adhesive layer may be decomposed by irradiating ultraviolet light through the transparent first carrier substrate 404. The LTHC layer may absorb the ultraviolet radiation and may generate heat, which decomposes the material of the LTHC layer and cause the transparent first carrier substrate 404 to be detached from the power routing layers 107. In embodiments in which the adhesive layer includes a thermally decomposing adhesive material, a thermal anneal process at a debonding temperature may be performed to detach the first carrier substrate 404 from the power routing layers 107.

FIG. 4H is a vertical cross-sectional view of a structure 400h including two first semiconductor dies 102 supported on the dicing frame 406, according to various embodiments. In this embodiment, the first semiconductor dies 102 may be formed as double-sided semiconductor dies. The structure 400h may be formed by dicing the intermediate structure 400g of FIG. 4G to thereby singulate the intermediate structure 400g into a plurality of individual first semiconductor dies 102. In this example embodiment, the process of dicing the intermediate structure 400g generates two first semiconductor dies 102. Various other numbers of first semiconductor dies 102 may be generated in other embodiments. The first semiconductor dies 102 may then be removed from the dicing frame 406 and may be attached to a second carrier substrate 502 (e.g., see FIG. 5D) to form an intermediate structure 500d that may be used to form the first die package component 302 (e.g., see FIGS. 3A and 3C, and related description, above).

Figure 5A:
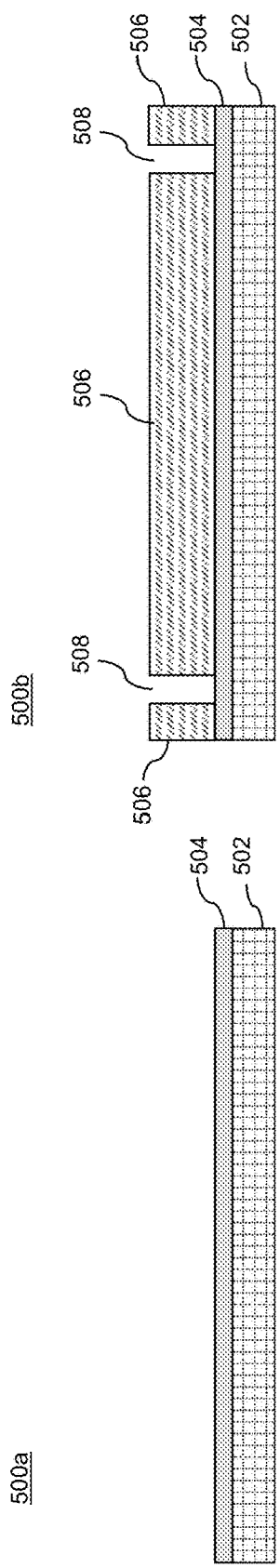
FIG. 5A is a vertical cross-sectional view of an intermediate structure that may be used in forming one or more through-molding-vias of the first die package component (also referred to as a first interposer), according to various embodiments.
Figure 5B:
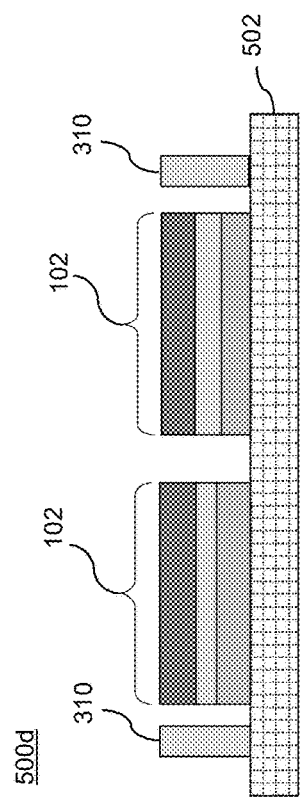
FIG. 5B is a vertical cross-sectional view of a further intermediate structure that may be used in forming one or more through-molding-vias of the first die package component, according to various embodiments.
Figure 5C:
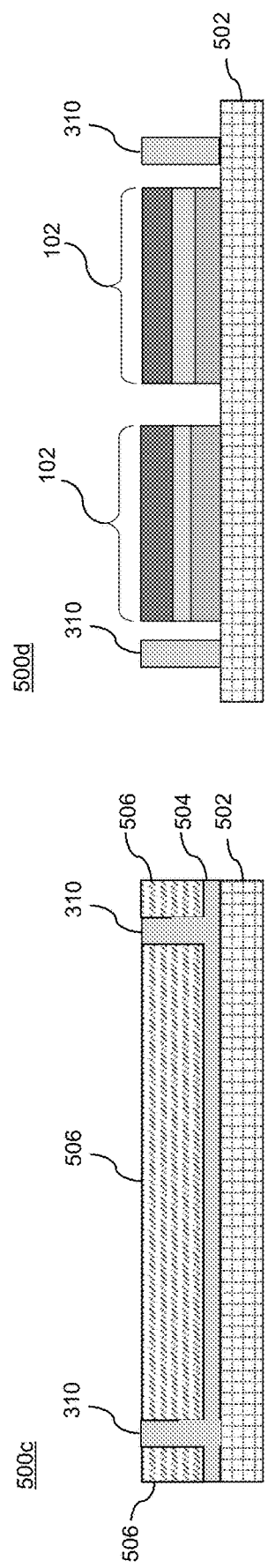
FIG. 5C is a vertical cross-sectional view of a further intermediate structure that may be used in forming one or more through-molding-vias of the first die package component, according to various embodiments.

FIGS. 5A, 5B, and 5C are vertical cross-sectional views of respective intermediate structures 500a, 500b, and 500c that may be used in forming one or more through-molding-vias 310 of the first die package component 302, according to various embodiments. The intermediate structure 500a may include a second carrier substrate 502 having a seed layer 504 formed thereon. The seed layer 504 may be formed by sputtering. The intermediate structure 500b may include a patterned photoresist 506 formed over the seed layer 504. The patterned photoresist may include openings 508 formed in the patterned photoresist 506. In the intermediate structure 500c of FIG. 5C, the through-molding-vias 310 may be formed by electroplating a metallic fill material (such as copper, nickel, or a stack of copper and nickel) into the openings 508 of the patterned photoresist 506 of the intermediate structure 500b of FIG. 5B.

The metallic seed layer may include, for example, a stack of a titanium barrier layer and a copper seed layer. The titanium barrier layer may have thickness in a range from 50 nm to 400 nm, and the copper seed layer may have a thickness in a range from 100 nm to 500 nm. The metallic fill material may include copper, nickel, or copper and nickel. Other suitable metallic fill materials are within the contemplated scope of disclosure.

After forming the through-molding-vias 310, the patterned photoresist 506 may then be removed by ashing or dissolution in a solvent. Portions of the seed layer 504 may then be etched in regions between the electroplated metallic fill material portions to generate the through-molding-vias 310 as separated structures formed on the second carrier substrate 502 as shown, for example, in FIG. 5D.

Figure 5D:
FIG. 5D is a vertical cross-sectional view of a further intermediate structure that may be used in forming the first die package component, according to various embodiments.

FIG. 5D is a vertical cross-sectional view of a further intermediate structure 500d that may be used in forming the first die package component 302, according to various embodiments. As shown, the intermediate structure 500d may include the through-molding-vias 310 attached to the second carrier substrate 502, which may be formed by the process described with reference to FIGS. 5A to 5C, above. The intermediate structure 500d may further include the two first semiconductor dies 102 formed by the process described with reference to FIGS. 4A to 4H, above. The first semiconductor dies 102 may be attached to the second carrier substrate 502 using an adhesive layer (not shown).

FIG. 5E is a vertical cross-sectional view of a further intermediate structure 500e that may be used in forming the first die package component 302, according to various embodiments. The intermediate structure 500e may be formed from the intermediate structure 500d may forming a molding material 106 around the first semiconductor dies 102 and the through-molding-vias 310. The molding material 106 may be epoxy molding compound (EMC) that may be applied to the gaps between contiguous assemblies of first semiconductor dies 102 and the through-molding-vias 310. The molding material 106 may be configured to provide mechanical support for the first semiconductor dies 102 and the through-molding-vias 310. The EMC may include an epoxy-containing compound that may be hardened (i.e., cured) to provide a dielectric material portion having sufficient stiffness and mechanical strength. In this regard, Young's modulus of pure epoxy is about 3.35 GPa, and Young's modulus of the molding material 106 may be higher than Young's modulus of pure epoxy by adding additives. Young's modulus of the molding material 106 may be greater than 3.5 GPa.

The EMC may include epoxy resin, hardener, silica (as a filler material), and other additives. The EMC may be provided in a liquid form or in a solid form depending on the viscosity and flowability. Liquid EMC provides better handling, good flowability, less voids, better fill, and less flow marks. Solid EMC provides less cure shrinkage, better stand-off, and less die drift. A high filler content (such as 85% in weight) within an EMC may shorten the time in mold, lower the mold shrinkage, and reduce the mold warpage. Uniform filler size distribution in the EMC may reduce flow marks, and may enhance flowability. The curing temperature of the EMC may be in a range from 125° C. to 150° C. Portions of the molding material 106 that overlies a horizontal plane (including top surfaces of the first semiconductor dies 102) may be removed by a planarization process. For example, the portions of the molding material 106 that overlies the horizontal plane may be removed using a chemical mechanical planarization (CMP).

FIG. 5F is a vertical cross-sectional view of a further intermediate structure 500f that may be used in forming the first die package component 302, according to various embodiments. The intermediate structure 500f may be formed from the intermediate structure 500e of FIG. 5E by forming first bonding pads 512 on each of the first semiconductor dies 102 and the through-molding-vias 310. The first bonding pads 512 may be formed by depositing and patterning a stack of at least one metallic material. The metallic fill material for the first bonding pads 512 may include copper. Other suitable materials are within the contemplated scope of disclosure. The thickness of the first bonding pads 512 may be in a range from 5 microns to 100 microns, although lesser or greater thicknesses may also be used. The first bonding pads 512 may have horizontal cross-sectional shapes of rectangles, rounded rectangles, or circles. Other suitable shapes are within the contemplated scope of disclosure.

In embodiments in which the first bonding pads 512 are formed as C4 (controlled collapse chip connection) pads, the thickness of the first bonding pads 512 may be in a range from 5 microns to 50 microns, although lesser or greater thicknesses may also be used. In some embodiments, the first bonding pads 512 may be, or may include, underbump metallization (UBM) structures. Alternatively, the first bonding pads 512 may be configured for microbump bonding (i.e., C2 bonding), and may have a thickness in a range from 30 microns to 100 microns, although lesser or greater thicknesses may also be used. In such an embodiment, the first bonding pads 512 may be formed as an array of microbumps (such as copper pillars) having a lateral dimension in a range from 10 microns to 25 microns, and having a pitch in a range from 20 microns to 50 microns.

FIG. 5G is a vertical cross-sectional view of a further intermediate structure 500g that may be used in forming the first die package component 302, according to various embodiments. The intermediate structure 500g may be formed from the intermediate structure 500f of FIG. 5F by forming a temporary adhesive layer 514 over the first bonding pads 512 and attaching a third carrier substrate 516 to the temporary adhesive layer 514. As in other embodiments, described above, the temporary adhesive layer 514 may be a LTHC that may be a solvent-based coating applied using a spin coating method. The LTHC layer may convert ultraviolet light to heat, which may cause the material of the LTHC layer to lose adhesion. Alternatively, the adhesive layer may include a thermally decomposing adhesive material. For example, the adhesive layer may include an acrylic pressure-sensitive adhesive that decomposes at an elevated temperature. The debonding temperature of the thermally decomposing adhesive material may be in a range from 150 degrees to 200 degrees Celsius.

FIG. 5H is a vertical cross-sectional view of a further intermediate structure 500h that may be used in forming the first die package component 302, according to various embodiments. The intermediate structure 500h of FIG. 5H may be formed from the intermediate structure 500g by removing the second carrier substrate 502. For example, as in other embodiment, an adhesive layer (e.g., formed between the second carrier substrate 502 and the first semiconductor dies 102, the molding material 106, and the through-molding-vias 310) may be decomposed by ultraviolet radiation or by a thermal anneal at a debonding temperature. In embodiments in which the second carrier substrate 502 includes an optically transparent material and the adhesive layer includes an LTHC layer, the adhesive layer may be decomposed by irradiating ultraviolet light through the transparent second carrier substrate 502. The LTHC layer may absorb the ultraviolet radiation and may generate heat, which decomposes the material of the LTHC layer and cause the transparent second carrier substrate 502 to be detached from the power routing layers 107. In embodiments in which the adhesive layer includes a thermally decomposing adhesive material, a thermal anneal process at a debonding temperature may be performed to detach the second carrier substrate 502 from the power routing layers 107.

Figure 5I:
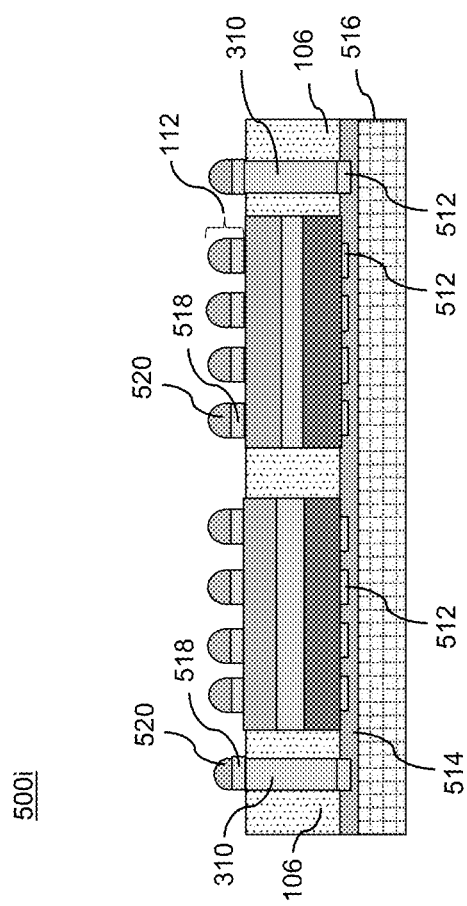
FIG. 5I is a vertical cross-sectional view of a further intermediate structure that may be used in forming the first die package component, according to various embodiments.

FIG. 5I is a vertical cross-sectional view of a further intermediate structure 500i that may be used in forming the first die package component 302, according to various embodiments. The intermediate structure 500i may be formed from the intermediate structure 500h by formation of second bonding pads 518 and first solder material portion 520 respectively on the first semiconductor dies 102 and through-molding-vias 310. In this regard, second bonding pads 518 and the first solder material portions 520 may be formed by depositing and patterning a stack of at least one metallic material that may function as metallic bumps (e.g., first metal bumps 112, described above) and a solder material layer. The metallic fill material for the second bonding pads 518 may include copper. Other suitable materials are within the contemplated scope of disclosure. The thickness of the second bonding pads 518 may be in a range from 5 microns to 100 microns, although lesser or greater thicknesses may also be used.

The second bonding pads 518 and the first solder material portions 520 may have horizontal cross-sectional shapes of rectangles, rounded rectangles, or circles. Other suitable shapes are within the contemplated scope of disclosure. In embodiments in which the second bonding pads 518 are formed as C4 (controlled collapse chip connection) pads, the thickness of the second bonding pads 518 may be in a range from 5 microns to 50 microns, although lesser or greater thicknesses may also be used. In some embodiments, the second bonding pads 518 may be, or include, underbump metallization (UBM) structures. Alternatively, the second bonding pads 518 may be configured for microbump bonding (i.e., C2 bonding), and may have a thickness in a range from 30 microns to 100 microns, although lesser or greater thicknesses may also be used. In such an embodiment, the second bonding pads 518 may be formed as an array of microbumps (such as copper pillars) having a lateral dimension in a range from 10 microns to 25 microns, and having a pitch in a range from 20 microns to 50 microns.

The first die package component 302 (e.g., see FIGS. 3A, 3C, and 6A to 6D) may be formed from the intermediate structure 500i by removing the third carrier substrate 516. For example, the temporary adhesive layer 514 may be decomposed by ultraviolet radiation or by a thermal anneal at a debonding temperature, as described above.

Figure 5J:
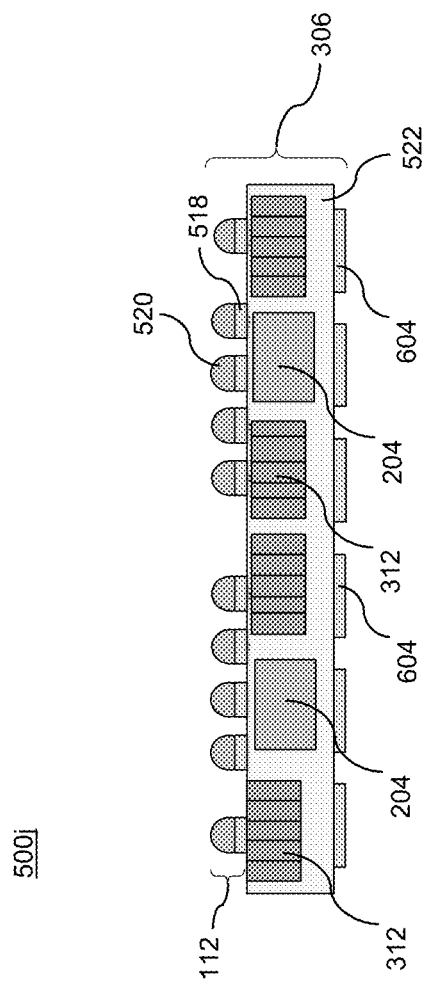
FIG. 5J is a vertical cross-sectional view of a third interposer, which may be formed using techniques described with reference to FIGS. 4A to 5I, according to various embodiments.

FIG. 5J is a vertical cross-sectional view of the third interposer 306, which may be formed using techniques described with reference to FIGS. 4A to 5I, according to various embodiments. In this example embodiment, the third interposer 306 may include one or more voltage regulator circuits 204 and one or more deep trench capacitors 312 formed in an interposer body 522. The one or more voltage regulator circuits 204 may be formed as double-sided semiconductor dies that are supported by the interposer body 522. In this regard, the interposer body 522 may include a molding material 106 (e.g., see FIG. 5I) that supports the one or more voltage regulator circuits 204. The one or more voltage regulator circuits 204 may include electrical connections that electrically connect to respective sides of the interposer body 522 (e.g., first bonding pads 518 and fourth bonding pads 604).

The one or more deep trench capacitors 312 may be separately-formed structures that are supported by the interposer body 522. In this regard, a plurality of a deep trench capacitors 312 may be formed on a substrate (not shown) such as a silicon substrate. The substrate may then be singulated to generate the one or more deep trench capacitors 312. The one or more voltage regulator circuits 204 and one or more deep trench capacitors 312 may then be assembled and held together by forming the molding 106 (e.g., see FIG. 5I) around the one or more voltage regulator circuits 204 and one or more deep trench capacitors 312. The one or more voltage regulator circuits 204 and one or more deep trench capacitors 312 may then be electrically coupled to one another by the formation of redistribution structures including redistribution dielectric layers and redistribution wiring interconnects (not shown), which may be formed as part of the interposer body 522. The one or more redistribution layers may be formed as described in greater detail with reference to FIGS. 4D and 4E, above.

In alternative embodiments, the interposer body 522 may include a semiconductor substrate component (e.g., a silicon substrate) in which the one or more voltage regulator circuits 204 and one or more deep trench capacitors 312 may be formed. In this regard, CMOS circuits, forming the one or more voltage regulator circuits 204, may be formed in a FEOL process on the semiconductor substrate. Similarly, the one or more deep trench capacitors 312 may be formed concurrently with the CMOS circuits in the same FEOL process. Various electrical connections between the one or more voltage regulator circuits 204 and the one or more deep trench capacitors 312 may then be formed by forming various metal interconnect structures (not shown) within dielectric material layers formed over the one or more voltage regulator circuits 204 and the one or more deep trench capacitors 312 in a BEOL process. The fourth bonding pads 604 may then be formed so as to be electrically connected to the various interconnect structures. In an example embodiment, the semiconductor substrate of the interposer body 522 may be a silicon substrate. In this way, the third interposer 306 may be configured as a double-sided silicon interposer that is an active interposer (i.e., includes CMOS circuitry).

In the above-described embodiments, the third interposer 306 may include transistors, diodes, resistors, inductors, capacitors that may be implemented in CMOS circuits (e.g., implemented as the one or more voltage regulator circuits 204). The third interposer 306 may further include one or more deep trench capacitors 312 that may be configured to provide increased electrical charge storage. As such, the third interposer 306 may be configured to operate as a switched-mode voltage regulator in which switching circuitry (e.g., implemented with CMOS transistors) periodically switches passive storage elements (e.g., inductors and capacitors) between different electrical configurations. The output voltage generated by the third interposer 306 may be controlled by a feedback circuit (e.g., an operational amplifier implemented in CMOS circuits).

In other embodiments, the one or more deep trench capacitors 312 may be omitted. For example, an alternative switched-mode regulator may be formed using an inductor in place of, or in addition to, the one or more deep trench capacitors 312. In still further embodiments, the third interposer 306 may be implemented without capacitors or inductors. For example, a voltage regulator may be implemented as a liner-regulator using only resistors and a diode (e.g., a Zener diode) in a simple shunt regulator, or with resistors, a Zener diode, and a transistor in a simple series regulator. More sophisticated voltage regulators may be implemented using a feedback circuit that may include an operational amplifier, as described above with reference to the example switched-mode regulator that includes capacitors and/or inductors. Inductors may be formed as electrical conductors that exhibit an inductance. For example, an inductor may be formed as a conductor formed in a coil shape. Other inductors may include magnetic elements (not shown).

Various other voltage regulator circuits may be provided in other embodiments, which may be configured to convert DC current to DC current, AC current to DC current, DC current to AC, or AC current to AC current. In each example, the voltage regulator may be configured to provide an output current having a voltage that has a stable pre-determined value. The third interposer 306 may include two or more voltage regulator circuits 204 that may provide controlled voltages to respective other circuit components. For example, a first voltage regulator circuit 204 may provide a controlled voltage to the first semiconductor die 102 and a second voltage regulator circuit 204 may provide a controlled voltage to the second semiconductor die 104 (e.g., see FIG. 3A). Similarly, a separate third voltage regulator circuit 204 may provide a controlled voltage to the optical component 202. Each of the various voltage regulator circuits 204 may be configured in a similar way. Alternatively, one or more of the voltage regulator circuits 204 may have different circuit elements and may be configured to provide different voltages with different characteristics (e.g., providing DC vs. AC current). In still further embodiments, the third interposer 306 may provide a plurality of voltage regulator circuits 204 that may be configured as a multi-phase voltage regulator that provides AC current having different relative phases (e.g., 0°, 90°, 180°, etc.).

Figure 6A:
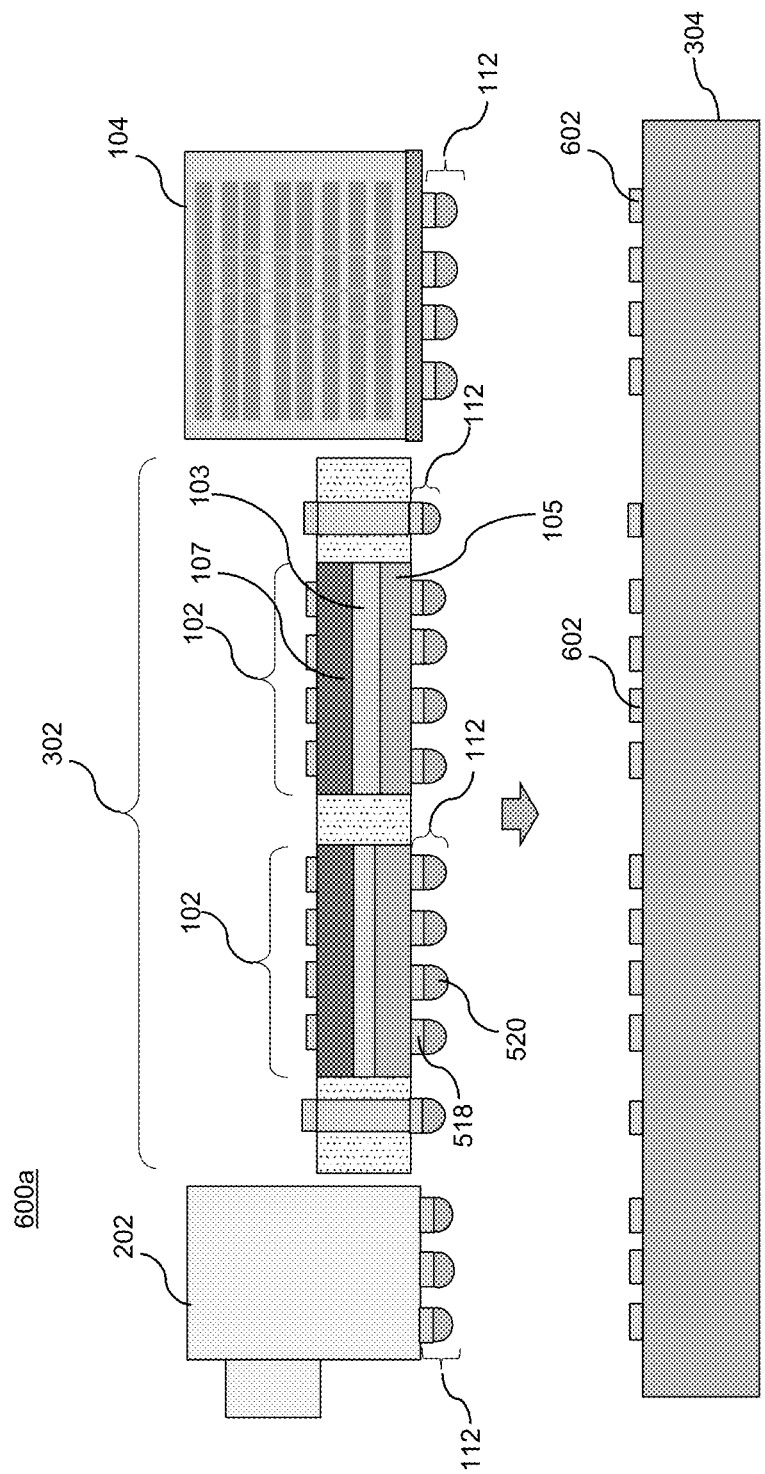
FIG. 6A is a vertical cross-sectional view of an intermediate structure that may be used to form the semiconductor device of FIG. 3A, according to various embodiments.

FIG. 6A is a vertical cross-sectional view of an intermediate structure 600a that may be used to form the semiconductor device 300a of FIG. 3A, according to various embodiments. The intermediate structure 600a may include the first die package component 302, the optical component 202, and a second semiconductor die 104 positioned relative to the second interposer 304. The first die package component 302 may be an active die package component that may be formed according to processes described with reference to FIGS. 4A to 5I, above. In this regard, the first die package component 302 may include first semiconductor dies 102 that may be configured as double-sided semiconductor dies having transistor layers 103, signal routing layers 105, and power routing layer 107. The transistor layers 103 may include circuits configured to control the second semiconductor die 104 and the optical component 202. As described above, the second semiconductor die 104 may be configured as an HBM die.

As shown in FIG. 6A, each of the first die package component 302, the optical component 202, and the second semiconductor die 104 may include first metal bumps 112 and may be configured to be bonded to corresponding third bonding pads 602 of the second interposer 304. In this regard, the first die package component 302, the optical component 202, and the second semiconductor die 104 may be brought into contact with the second interposer 304 such that first metal bumps 112 of the first die package component 302, the optical component 202, and the second semiconductor die 104 are brought into contact with corresponding third bonding pads 602 of the second interposer 304. A reflow operation may then be performed to reflow the first solder material portions 520 to thereby form bonds between the second bonding pads 518 of the first die package component 302, the optical component 202, and the second semiconductor die 104, and the third bonding pads 602 of the second interposer 304 as shown, for example, in FIG. 6B.

Figure 6B:
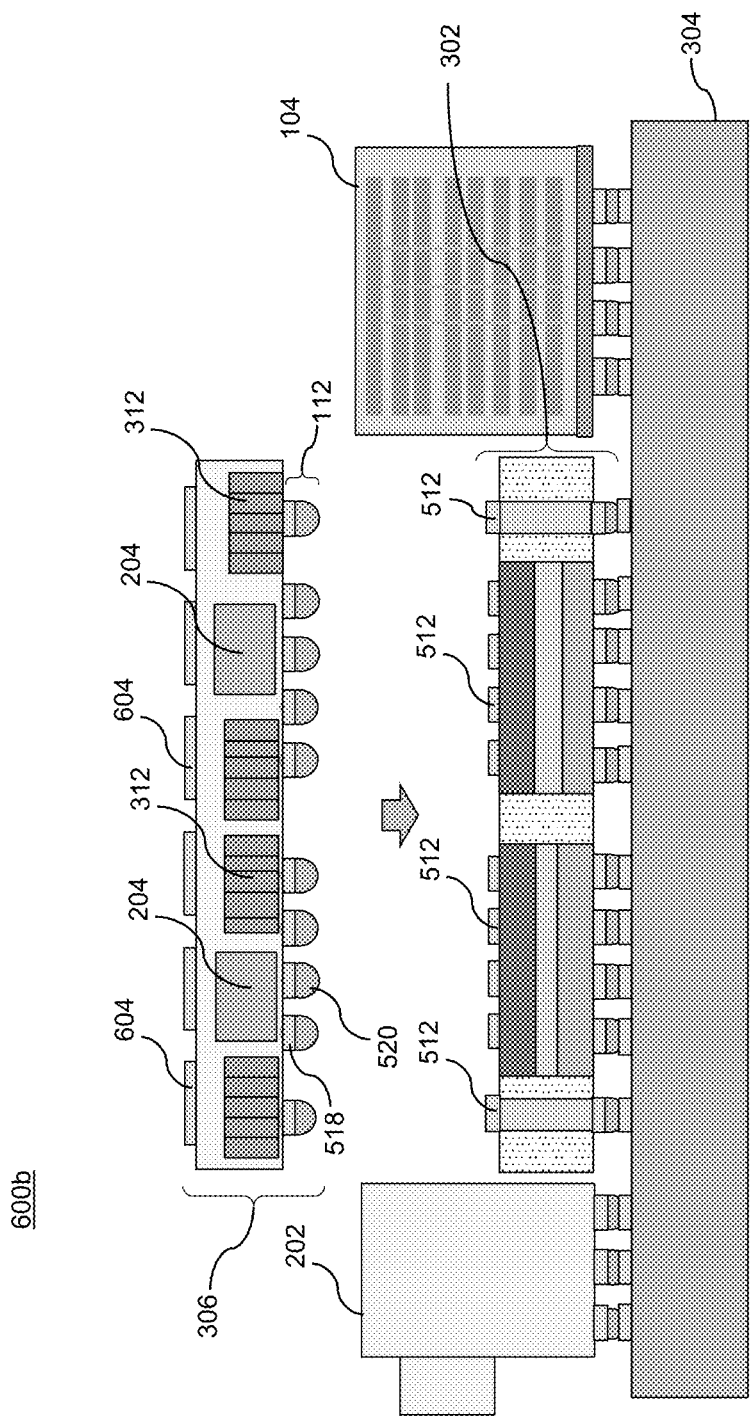
FIG. 6B is a vertical cross-sectional view of a further intermediate structure that may be used to form the semiconductor device of FIG. 3A, according to various embodiments.

As described above, the second interposer 304 may be configured as a passive interposer that includes electrical interconnects that may form electrical pathways between the first die package component 302, the optical component 202, and the second semiconductor die 104, once the first die package component 302, the optical component 202, and the second semiconductor die 104 are bonded to the second interposer 304, as shown in FIG. 6B.

FIG. 6B is a vertical cross-sectional view of a further intermediate structure 600b that may be used to form the semiconductor device 300a of FIG. 3A, according to various embodiments. As shown, the intermediate structure 600b of FIG. 6B includes the optical component 202, and the second semiconductor die 104, which are attached and electrically coupled to the second interposer 304. The intermediate structure 600b further includes the third interposer 306 positioned relative to the first die package component 302. As described above, the third interposer 306 may be an active interposer that includes one or more voltage regulator circuits 204. The third interposer 306 may further include various passive electrical devices such as capacitors, inductors, resistors, diodes, etc. For example, the third interposer 306 may include one or more deep trench capacitors 312, as described above. The third interposer 306 may be formed using processes similar to those described with reference to FIGS. 4A to 5I, above. In this regard, the third interposer 306 may also be a double-sided interposer having first metal bumps 112 on a first side of the third interposer 306 (e.g., the lower side facing the first die package component 302 in FIG. 6B). The third interposer 306 may further have fourth bonding pads 604 formed on a second side of the third interposer 306 as shown, for example, in FIG. 6B.

The first metal bumps 112 of third interposer 306 may be configured to be bonded to corresponding first bonding pads 512 of the first die package component 302. In this regard, the third interposer 306 may be brought into contact with the first die package component 302 such that first metal bumps 112 of the third interposer 306 are brought into contact with corresponding first bonding pads 512 of the first die package component 302. A reflow operation may then be performed to reflow the first solder material portions 520 to thereby form bonds between the second bonding pads 518 of the third interposer 306 and the first bonding pads 512 of the first die package component 302 as shown, for example, in FIG. 6C.

Figure 6C:
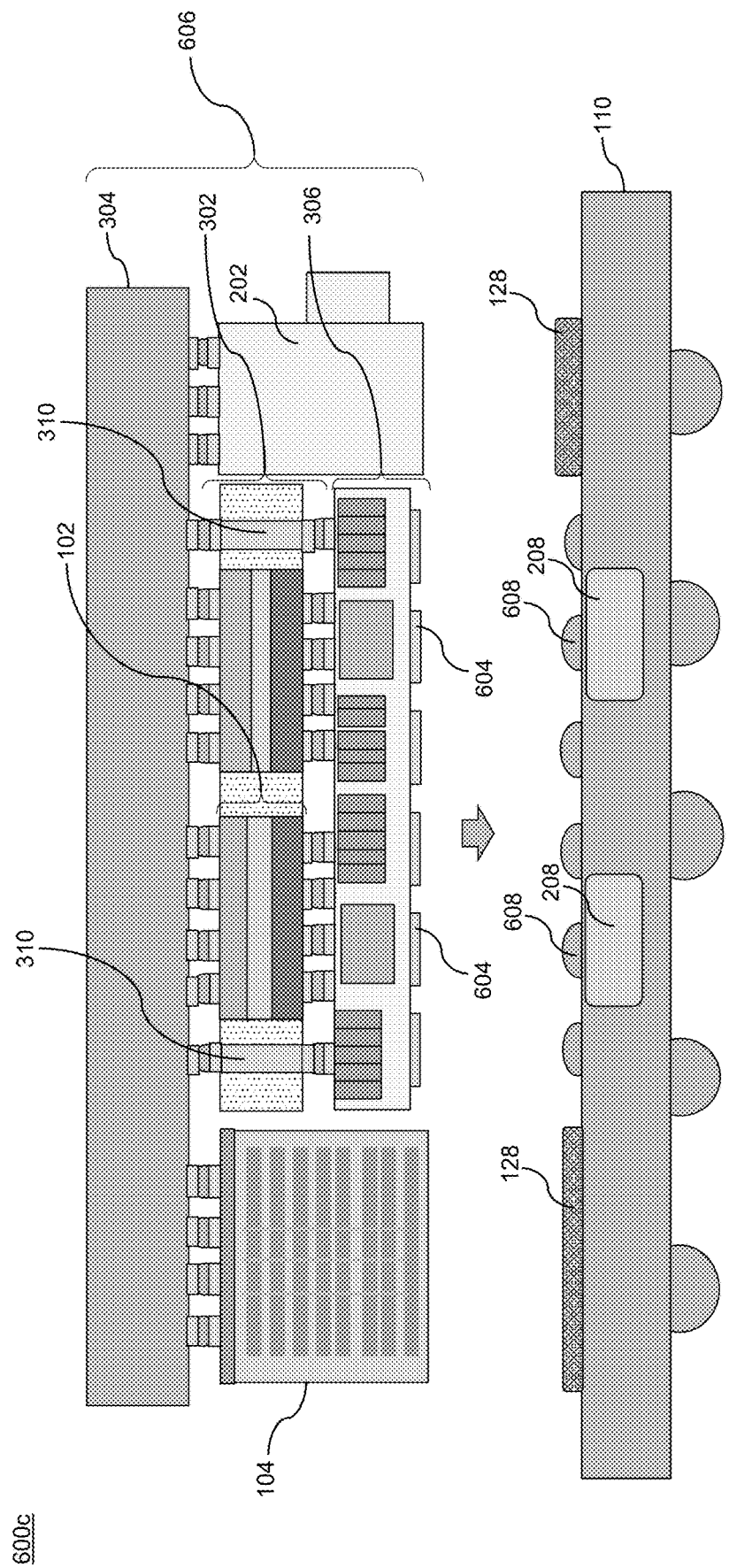
FIG. 6C is a vertical cross-sectional view of a further intermediate structure that may be used to form the semiconductor device of FIG. 3A, according to various embodiments.

FIG. 6C is a vertical cross-sectional view of a further intermediate structure 600c that may be used to form the semiconductor device 300a of FIG. 3A, according to various embodiments. As shown, the intermediate structure 600c may include a first subassembly 606 positioned relative to a package substrate 110. The first subassembly 606 may include the first die package component 302, the second interposer 304, the third interposer 306, the optical component 202, and the second semiconductor die 104. As described above with reference to FIGS. 6A and 6B, each of the first die package component 302, the second interposer 304, the third interposer 306, the optical component 202, and the second semiconductor die 104 may be electrically connected such that electrical pathways are formed between the first die package component 302, the optical component 202, and the second semiconductor die 104. Further electrical connections may be formed between the first die package component 302 and the third interposer 306, and between the third interposer 306 and the second interposer 304. In this regard, the one or more through-molding-vias 310 may provide direct electrical connections between the third interposer 306 and the second interposer 304 that bypass the one or more first semiconductor dies 102 of the first die package component 302.

The package substrate 110 may include second solder material portions 608 formed over bonding pads (not shown) of the package substrate 110. As such, the first subassembly 606 may be attached to, and electrically coupled to, the package substrate 110 by positioning the first subassembly 606 such that the fourth bonding pads 604 of the third interposer 306 come into contact with the second solder material portions 608 of the package substrate 110. A reflow operation may then be performed to join the third interposer 306 to the package substrate 110. In this way, the first subassembly 606 may be attached to the package substrate 110 as shown, for example, in FIG. 6D. The third interposer 306 may thereby be configured to receive electrical power from the package substrate 110.

As described above, the package substrate 110 may be provided with one or more second thermal interface materials 128. Thus, when the first subassembly 606 is attached to the package substrate 110, the second thermal interface materials 128 may make contact between lower surfaces of the optical component 202 and the second semiconductor die 104, and an upper surface of the package substrate 110. In this way, heat transfer among the optical component 202, the second semiconductor die 104, and the package substrate 110 may be enhanced. As described above, the package substrate 110 may include one or more substrate mounted devices 208 formed within the package substrate. Such substrate mounted devices 208 may become electrically coupled to the third interposer 306 through electrical connections between the package substrate 110 and the third interposer 306.

Figure 6D:
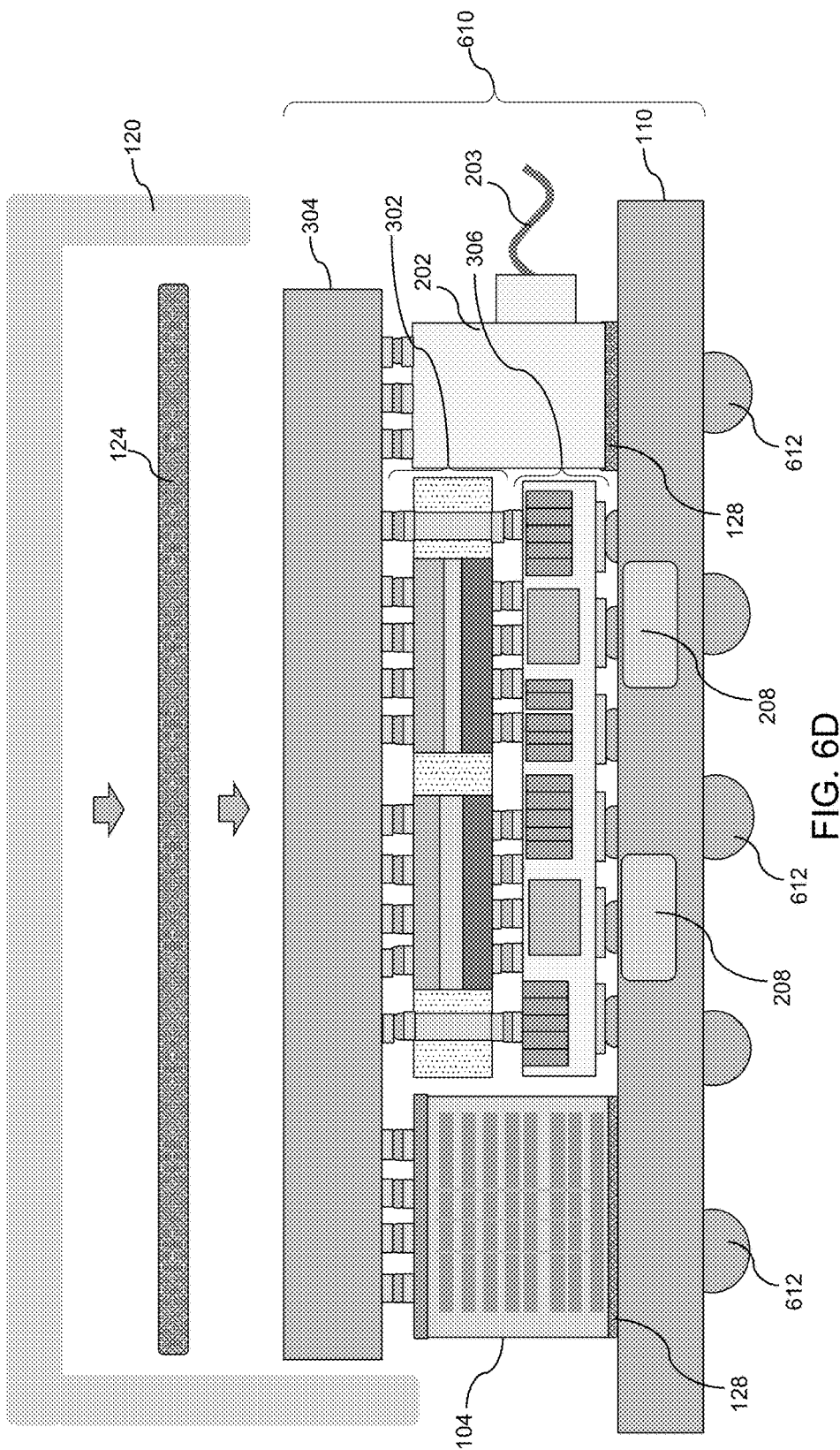
FIG. 6D is a vertical cross-sectional view of a further intermediate structure that may be used to form the semiconductor device of FIG. 3A, according to various embodiments.

FIG. 6D is a vertical cross-sectional view of a further intermediate structure 600d that may be used to form the semiconductor device 300a of FIG. 3A, according to various embodiments. As shown, the intermediate structure 600d may include a second subassembly 610 that is formed by attaching the first subassembly 606 to the package substrate 110, as described above with reference to FIG. 6C. The second subassembly 610 may include the first die package component 302, the second interposer 304, the third interposer 306, the optical component 202, the second semiconductor die 104, and the package substrate 110. The intermediate structure 600d may further include a first thermal interface material 124 and a package lid 120. The first thermal interface material 124 may be formed on a top surface of the second interposer 304 or on an interior surface of the package lid 120. The package lid 120 may then be attached to the package substrate 110. In this way, the first thermal interface material 124 may contact the top surface of the second interposer 304 and the internal surface of the package lid 120 to thereby enhance heat transfer between the second interposer 304 and the package lid 120. The package substrate 110 may further include third solder material portions 612 formed on bonding pads (not shown) of the package substrate 110 to form the second metal bumps 116 of FIG. 3A. As such, the package substrate 110 may be attached and electrically coupled to a PCB 206 to thereby form the semiconductor device 300a of FIG. 3A.

Figure 7:
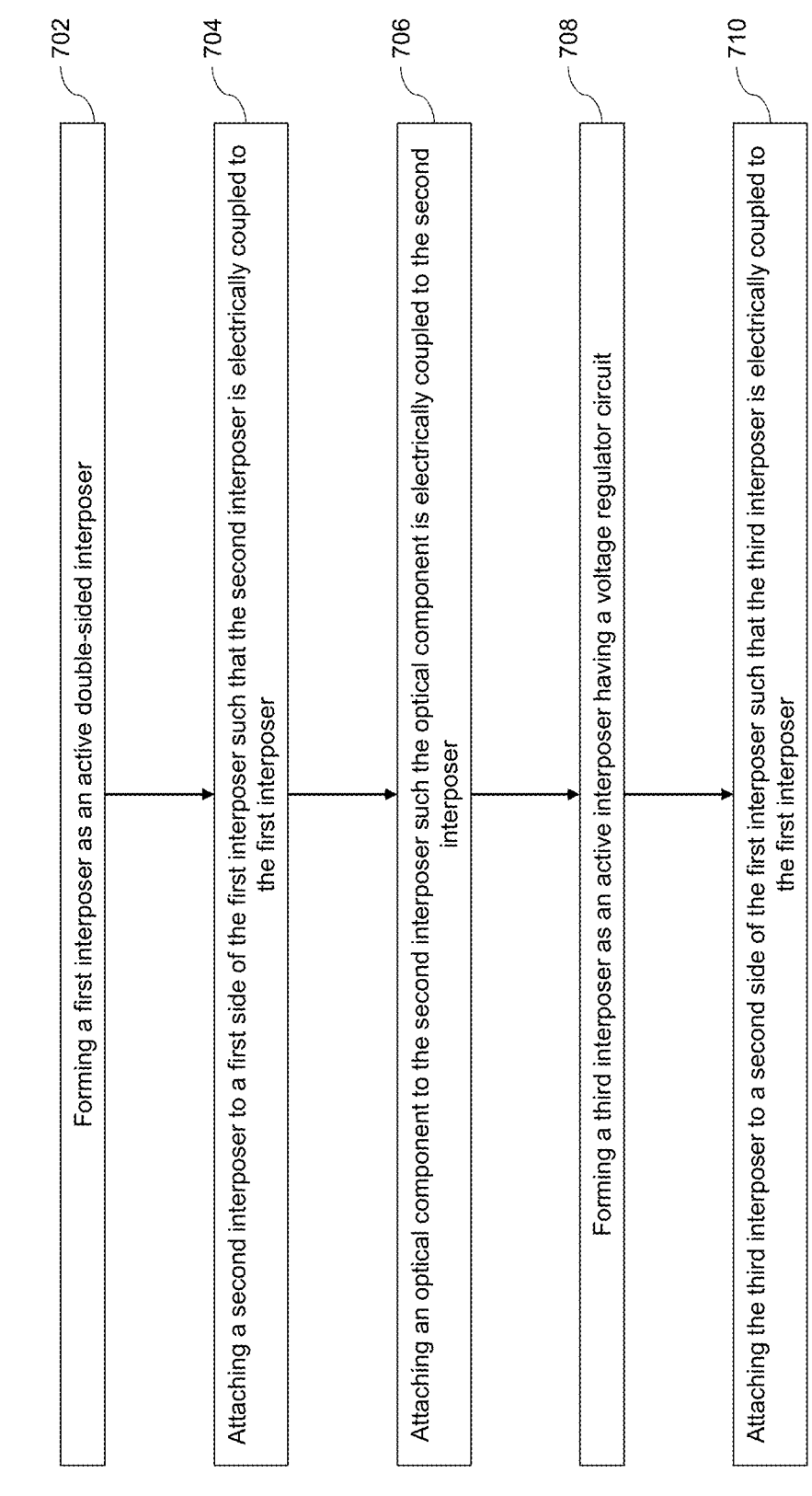
FIG. 7 is a flowchart illustrating operations of a method of fabricating a semiconductor device, according to various embodiments.

FIG. 7 is a flowchart illustrating operations of a method 700 of fabricating a semiconductor device 300a, according to various embodiments. In operation 702, the method 700 may include forming a first die package component 302 as an active double-sided interposer (e.g., see FIGS. 4A to 5I and related description, above). In operation 704, the method 700 may include attaching a second interposer 304 to a first side of the first die package component 302 such that the second interposer 304 is electrically coupled to the first die package component 302. In operation 706, the method 700 may include attaching an optical component 202 to the second interposer 304 such the optical component 202 is electrically coupled to the second interposer 304. In operation 708, the method 700 may include forming a third interposer 306 as an active interposer having a voltage regulator circuit 204. As described above, the third interposer 306 may be formed using processes similar to those used to form the first die package component 302 (e.g., see FIGS. 4A to 5I and related description, above). In operation 710, the method 700 may further include attaching the third interposer 306 to a second side of the first die package component 302 such that the third interposer 306 is electrically coupled to the first die package component 302.

Operation 702 of the method 700 may further include forming a double-sided semiconductor die (e.g., first semiconductor die 102) (e.g., see FIGS. 4A to 4H and related description); forming a molding material 106 (e.g., see FIG. 5E) that supports the double-sided semiconductor die (e.g., first semiconductor die 102); and forming a through-molding-via 310 (e.g., see FIGS. 5A to 5C) in the molding material 106. As described above, the through-molding-via 310 may be configured to provide an electrical connection between the second interposer 304 and the third interposer 306 that bypasses the double-sided semiconductor die (e.g., first semiconductor die 102) of the first die package component 302.

The method 700 may further include attaching a high-bandwidth-memory die (e.g., second semiconductor die 104) to the first die package component 302 (e.g., see FIGS. 6A and 6B) such that the high-bandwidth-memory die (e.g., second semiconductor die 104) is electrically coupled to the second interposer 304. The method 700 may further include attaching a package substrate 110 to the third interposer 306 such that the third interposer 306 is electrically coupled to the package substrate 110 (e.g., see FIGS. 6C and 6D). Further, the third interposer 306 may be configured to receive electrical power from the package substrate 110. The method 700 may further include attaching a package lid 120 to the package substrate 110 such that the package lid 120 is covering a surface of the second interposer 304 opposite to the first die package component 302 (e.g., see FIGS. 3A and 6D).

Referring to all drawings and according to various embodiments of the present disclosure, a semiconductor device 300a (e.g., see FIG. 3A) is provided. The semiconductor device 300a may include a first die package component 302 (also referred to as a first interposer 302); a second interposer 304 electrically coupled to a first side of the first die package component 302; a third interposer 306 electrically coupled to a second side of the first die package component 302; and an optical component 202 electrically coupled to the second interposer 304. The third interposer 306 may further include a voltage regulator circuit 204. The first die package component 302 may further include a double-sided semiconductor die (e.g., first semiconductor die 102) (e.g., see FIGS. 3A, and 4A to 4H). A first side of the double-sided semiconductor die (e.g., first semiconductor die 102) may be electrically coupled to the second interposer 304 (e.g., see FIGS. 6A and 6B), and a second side of the double-sided semiconductor die (e.g., first semiconductor die 102) may electrically coupled to the third interposer 306 (e.g., see FIGS. 6B and 6C). The first die package component 302 may further include a molding material 106 and a through-molding-via 310 formed in the molding material 106, such that the through-molding-via 310 provides an electrical connection between the second interposer 304 and the third interposer 306 that bypasses the double-sided semiconductor die (e.g., first semiconductor die 102) of the first die package component 302.

The semiconductor device 300a may further include a high-bandwidth-memory die (e.g., second semiconductor die 104) electrically coupled to the second interposer 304. As described above, the first die package component 302 may be an active interposer further including a first semiconductor die 102 that is configured to control one or both of the optical component 202 and the high-bandwidth-memory die (e.g., second semiconductor die 104). The third interposer 306 may further include a deep trench capacitor 312. The third interposer 306 may further include two or more voltage regulator circuits 204 that may be configured to control electrical power provided to two or more respective components of the semiconductor device 300a.

The semiconductor device 300a may further include a package substrate 110 electrically coupled to the third interposer 306 (e.g., see FIGS. 3A, 6C, and 6D) such that the third interposer 306 may be configured to receive electrical power from the package substrate 110 and to provide the electrical power to the first die package component 302 and the second interposer 304. The semiconductor device 300a may further include a package lid 120 (e.g., see FIGS. 3A and 6D) attached to the package substrate 110 and covering a top surface of the second interposer 304 opposite to the first die package component 302. The semiconductor device 300a may further include a first thermal interface material 124 formed between an internal surface of the package lid 120 and the top surface of the second interposer 304 opposite to the first die package component 302 (e.g., see FIGS. 3A and 6D). The package substrate 110 may further include one or more substrate mounted devices 208 that are electrically coupled to the third interposer 306 (e.g., see FIGS. 3A, 3C, and 6D). Such substrate mounted devices 208 may include a capacitor, an inductor, or a resistor. The semiconductor device 300a may further include a second thermal interface material 128 formed between the optical component 202 and a surface of the package substrate 110.

In a further embodiment, a semiconductor device 300a (e.g., see FIG. 3A) is provided. The semiconductor device 300a may include a first die package component 302. The first die package component 302 may include a double-sided semiconductor die (e.g., first semiconductor die 102); a molding material 106 that supports the double-sided semiconductor die (e.g., first semiconductor die 102); and a through-molding-via 310 formed in the molding material 106. The semiconductor device 300a may further include a second interposer 304; a third interposer 306 having a voltage regulator circuit 204; and an optical component 202. The first die package component 302 and the optical component 202 may be electrically coupled to and disposed on a bottom surface of the second interposer 304, and the third interposer 306 may be electrically coupled to and disposed on a bottom surface of the first die package component 302. A first side of the double-sided semiconductor die (e.g., first semiconductor die 102) may be electrically coupled to the second interposer 304, the second interposer 304 may be electrically coupled to a high-bandwidth-memory die (e.g., second semiconductor die 104) (e.g., see FIG. 3A), a second side of the double-sided semiconductor die (e.g., first semiconductor die 102) may be electrically coupled to the third interposer 306, and the through-molding-via 310 may be configured to provide an electrical connection between the second interposer 304 and the third interposer 306 that bypasses the double-sided semiconductor die (e.g., first semiconductor die 102).The double-sided semiconductor die (e.g., first semiconductor die 102) may further include an input/output circuit (e.g., formed in the transistor layers 103; see FIGS. 3A and 6A) that may be configured to control the optical component 202 to transmit and receive optical signals, and a power routing circuit configured to receive electrical power from the voltage regulator circuit 204 of the third interposer 306.

The disclosed embodiments provide advantages over existing systems by using a multi-interposer stacked configuration that reduces interconnect lengths by placing components closer to one another. In this regard, a disclosed embodiment semiconductor device integrates an optical system, a high-bandwidth memory die, voltage regulator circuits, and logic and control circuits, on a single package substrate. The optical system and the high-bandwidth memory die may be configured to communicate with one another through a passive interposer. The passive interposer may be stacked with a first active interposer that includes control and logic circuitry, which in turn, communicates with a further stacked active interposer that may include the voltage regulator circuits. The stacked configuration of the three interposers provides a semiconductor device with a high degree of integration and relatively short interconnect lengths.

The foregoing outlines features of several embodiments so that those skilled in the art may better understand the aspects of this disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of this disclosure, and that they may make various changes, substitutions, and alterations herein without departing from the spirit and scope of the present disclosure.

What is claimed is:

1. A method of fabricating a semiconductor device, comprising:
    forming a first die package component as an active double-sided interposer;
    attaching a second interposer to a first side of the first die package component such that the second interposer is electrically coupled to the first die package component;
    attaching an optical component to the second interposer such the optical component is electrically coupled to the second interposer, wherein the optical component includes an optical fiber;
    forming a third interposer as an active interposer having a voltage regulator circuit;
    attaching the third interposer to a second side of the first die package component such that the third interposer is electrically coupled to the first die package component; and
    attaching a package lid such that the package lid is covering a surface of the second interposer opposite to the first die package component and includes an opening such that the optical fiber extends through the opening.

2. The method of claim 1, wherein forming the first die package component further comprises:
    forming a double-sided semiconductor die having electrical connections on opposite sides of the double-sided die;
    forming a molding material that supports the double-sided semiconductor die; and
    forming a through-molding-via in the molding material, wherein the through-molding-via is configured to provide an electrical connection between the second interposer and the third interposer that bypasses the double-sided semiconductor die.

3. The method of claim 1, further comprising attaching a high-bandwidth-memory die to the second interposer such that the high-bandwidth-memory die is electrically coupled to the second interposer.

4. The method of claim 1, further comprising attaching a package substrate to the third interposer such that the third interposer is electrically coupled to the package substrate, wherein the third interposer is configured to receive electrical power from the package substrate.

5. The method of claim 4, wherein the package lid is attached to the package substrate.

6. The method of claim 4, further comprising forming a thermal interface material between the optical component and a surface of the package substrate.

7. The method of claim 1, further comprising mounting one or more substrate mounted devices to the third interposer such that the third interposer is electrically coupled to the one or more substrate mounted devices, wherein the one or more substrate mounted devices comprise a capacitor, an inductor, or a resistor.

8. A method of fabricating a semiconductor device, comprising:
forming a first die package component as an active double-sided interposer;
attaching a second interposer to a first side of the first die package component such that the second interposer is electrically coupled to the first die package component;
forming a third interposer as an active interposer; and
attaching the third interposer to a second side of the first die package component such that the third interposer is electrically coupled to the first die package component,
wherein the second interposer and third interposer are electrically connected by a through-molding-via located within the first die package.

9. The method of claim 8, wherein forming the first die package component further comprises:
forming a double-sided semiconductor die having electrical connections on opposite sides of the double-sided die;
forming a molding material; and
forming a through-molding-via in the molding material.

10. The method of claim 8, further comprising attaching a high-bandwidth-memory die to the second interposer such that the high-bandwidth-memory die is electrically coupled to the second interposer.

11. The method of claim 8, further comprising attaching an optical component to the second interposer such that the optical component is electrically coupled to the second interposer.

12. The method of claim 8, further comprising attaching a package substrate to the third interposer such that the third interposer is electrically coupled to the package substrate.

13. The method of claim 12, further comprising attaching a package lid to the package substrate such that the package lid is covering a surface of the second interposer opposite to the first die package component.

14. The method of claim 8, further comprising mounting one or more substrate mounted devices to the third interposer such that the third interposer is electrically coupled to the one or more substrate mounted devices, wherein the one or more substrate mounted devices comprise a capacitor, an inductor, or a resistor.

15. A method of fabricating a semiconductor device, comprising:
forming a first die package component, comprising:
forming a semiconductor die;
forming a molding material that supports the semiconductor die; and
forming a through-molding-via in the molding material;
attaching a second interposer to a first side of the first die package component; and
attaching a third interposer to a second side of the first die package component; and
attaching a package substrate to the third interposer,
wherein the second interposer and the third interposer are electrically coupled to the first die package component and the package substrate is electrically coupled to the third interposer,
wherein the through-molding-via is configured to provide an electrical connection between the second interposer and the third interposer.

16. The method of claim 15, further comprising attaching a high-bandwidth-memory die to the second interposer such that the high-bandwidth-memory die is electrically coupled to the second interposer.

17. The method of claim 15, further comprising attaching an optical component to the second interposer such that the optical component is electrically coupled to the second interposer.

18. The method of claim 15, further comprising attaching a package substrate to the third interposer such that the third interposer is electrically coupled to the package substrate.

19. The method of claim 18, further comprising attaching a package lid to the package substrate such that the package lid is covering a surface of the second interposer opposite to the first die package component.

20. The method of claim 15, further comprising mounting one or more substrate mounted devices to the third interposer such that the third interposer is electrically coupled to the one or more substrate mounted devices, wherein the one or more substrate mounted devices comprise a capacitor, an inductor, or a resistor.

* * * * *